(12) United States Patent
Hosono et al.

(10) Patent No.: US 6,879,520 B2
(45) Date of Patent: Apr. 12, 2005

(54) NON-VOLATILE SEMICONDUCTOR MEMORY DEVICE AND ELECTRIC DEVICE WITH THE SAME

(75) Inventors: Koji Hosono, Yokohama (JP); Hiroshi Nakamura, Fujisawa (JP); Kenichi Imamiya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/601,006

(22) Filed: Jun. 20, 2003

(65) Prior Publication Data

US 2004/0213031 A1 Oct. 28, 2004

(30) Foreign Application Priority Data

Apr. 22, 2003 (JP) ........................................ 2003-117333

(51) Int. Cl.$^7$ .............................................. G11C 16/04
(52) U.S. Cl. ............................ 365/185.17; 365/185.33; 365/189.05
(58) Field of Search ....................... 365/185.17, 185.33, 365/189.05, 185.2, 185.21, 185.22

(56) References Cited

U.S. PATENT DOCUMENTS 5,642,311 A * 6/1997 Cleveland et al. ....... 365/185.3
5,867,429 A    2/1999 Chen et al.
6,438,035 B2 * 8/2002 Yamamoto et al. ..... 365/185.21
2003/0142568 A1 * 7/2003 Giove et al. ................ 365/207

FOREIGN PATENT DOCUMENTS

JP    2001-267537    9/2001
JP    2001-274364    10/2001

OTHER PUBLICATIONS

U.S. Appl. No. 09/800,913, filed Mar. 8, 2001, Hsono et al.

* cited by examiner

Primary Examiner—Gene N. Auduong
(74) Attorney, Agent, or Firm—Hogan & Hartson, LLP

(57) ABSTRACT

A non-volatile semiconductor memory device includes: a memory cell array in which electrically rewritable floating gate type memory cells are arranged; and a plurality of sense amplifier circuits configured to read data from the memory cell array, wherein each the sense amplifier circuit is configured to sense cell data of a first memory cell selected from the memory cell array under a read condition determined in correspondence with cell data of a second memory cell adjacent to the first memory cell and written after the first memory cell.

17 Claims, 19 Drawing Sheets

NON-VOLATILE SEMICONDUCTOR MEMORY DEVICE AND ELECTRIC DEVICE WITH THE SAME

CROSS-REFERENCE TO RELATED APPLICATION

This application is based on and claims the benefit of priority from the Japanese Patent Application No. 2003-117333, filed on Apr. 22, 2003, the entire contents of which are incorporated herein by reference.

BACKGROUND OF THE INVENTION

1. Field of the Invention

This invention relates to a non-volatile semiconductor memory device and an electric device with the same, especially to a data read scheme for a NAND type flash memory which has miniaturized cells.

2. Description of Related Art

Currently known EEPROMs are formed to have a type of memory cell which stores charge in a floating gate thereof. In a NAND type flash memory, which is one of these EEPROMs, data rewriting operation is performed by using FN tunneling current in both of write and read operations. Recently, multi-value storing techniques are going to be introduced so as to store two bits in a memory cell, whereby it becomes possible to increase the memory capacity to be twice without changing the memory cell size.

However, the more miniaturized the NAND type flash memory is, the stronger the interference between the adjacent memory cells becomes, as a result of that the distance between cells becomes small (refer to, for example, Published Unexamined Japanese Patent Application No. 2001-267537). This can be said because that scaling in a vertical direction of the cell array is more difficult than that in a lateral direction.

More specifically, referring to FIG. 20, the interference between the adjacent cells will be described. FIG. 20 shows adjacent three memory cells MC0–MC2 in a NAND cell unit. Giving attention to the memory cell MC1, the floating gate FG1 is capacitively coupled with the control gate (i.e., word line) and the substrate (i.e. channel) by capacitances Cfgwl, Cfgch, respectively. If cells are miniaturized, the capacitance Cfgfg between the floating gates FG1 and FG0 (or FG2) in the adjacent cells MC0 (or MC2) will be relatively increased in comparison with the capacitance Cfgwl or Cfgch. The capacitive coupling between the adjacent floating gates harmfully influence the data read operation.

In detail, assume that after data having been written into the memory cell MC1, data write into the memory cell MC2 is performed. In this case, when data write is performed into the memory cell MC1, the floating gate. FG2 of the adjacent memory cell MC2 is held at a first potential. The floating gate FG2 becomes thereafter to be at a second potential as a result of the data writing into the memory cell MC2. Since the data read operation of the memory cell MC1 is influenced by the potential of the floating gate FG2 of the adjacent memory cell MC2, the threshold voltage of the cell MC1 will be changed before and after the writing of the memory cell MC2.

The influence for the above-described threshold voltage will be explained in detail, referring to FIGS. 21 and 22. FIG. 21 shows a NAND cell unit with four memory cells MC0–MC3. One end of the NAND cell unit is connected to source line CELSRC through a select transistor S1, and the other end to bit line BL through another select transistor S2. With respect to this NAND cell unit, it is assumed that data write is performed in order from the memory cell MC0 at the source line CELSRC side toward memory cell MC3 at the bit line BL side. To be written data is, for example, four-value data "00", "01", "10" or "11" as been expressed by 2-bit/1-cell that have threshold distributions as shown in FIG. 22.

It is noted that the memory cells MC0–MC3 are initialized at an erase state (data "11" state) with the lowest threshold before data writing. As shown in FIG. 21, data write from the erase state into a data state with threshold voltage Va (for example, data "00" shown in FIG. 21) is sequentially performed from the memory cell MC0 at the source line CELSRC side toward the memory cell MC3 at the bit line BL side. Write into the cell MC0, and the threshold becomes Va. When the next cell MC1 is written to have threshold Va, the threshold of the cell MC0 will be shifted from Va to Vb. Since write operation is done by use of electron injection into the floating gate, the potential of the floating gate is shifted in the negative direction by data writing. This potential shift of the floating gate affects the adjacent cell so as to increase the threshold voltage. In other words, as a result of that the potential of the adjacent cell's floating gate is shifted in the negative direction, the threshold of the memory cell under notice becomes higher. As similar to the above-described case, as the memory cell MC2 has be written after writing of the dell MC1, the threshold of the cell MC1 is shifted from Va to Vb. After written into the cell MC3, the threshold of the cell MC2 is shifted from Va to Vb. The threshold of the cell MC3 will be held at Va without being shifted because adjacent device thereof is the select transistor S2 without threshold variation.

In the example of FIG. 21, it has been explained for a case that all cells are sequentially written into the same data state. In a practical data write operation, data writing which affects to shift the threshold of the adjacent cell is not performed in some cases. Therefore, giving attention to, for example, the data "00" shown in FIG. 22, although the threshold distribution width is Vtw1 as far as there are no influences from the adjacent cell, it is widened to be Vtw2 by the influence from the adjacent cell.

In FIG. 22, threshold distributions are shown with respect to two cases: one case in which the influence from the adjacent cell is large; and the other case in which the influence is small. If the influence from the adjacent cell becomes large, some problems occur as follows. First, if the respective threshold distributions are widened due to the influence from the adjacent cell, it becomes necessary for widening the spaces between the respective threshold distributions in order to be sure to execute the precise data read operation of the written data. To do this, it is further required to increase the respective to-be-written thresholds. As a result, a difference between the lowest threshold (i.e., erase state) and the highest written threshold becomes large, thereby leading to a vicious cycle that potential variations of the adjacent cells become large, thereby further widening the respective threshold distributions. Second, a read-use pass voltage Vread, which is applied to non-selected word lines to turn on the non-selected cells, becomes high. This causes data read trouble.

To suppress the above-described interference between the cells, it will be a practical measure that data write is performed in such a manner as to make the respective data threshold distributions as narrow as possible. However, this results in that it takes a long time to write data into the NAND type flash memory. In detail, data writing of the NAND type flash memory is performed by write pulse applications and verify-reads thereafter which are periodically performed with stepping up the write pulse voltages little by little. The above-described scheme is used in consideration of the variation of the write characteristic. To make the threshold distribution narrow, it is necessary to make the step up of the write pulse voltage small. This results in that number of the write cycles is increased, and then write period becomes long.

As above described, as the miniaturization of the cells in the NAND type flash memory is progressed, it becomes a problem that interference between cells becomes large, whereby variation of written data threshold becomes large due to capacitive coupling between the floating gates.

SUMMARY OF THE INVENTION

A non-volatile semiconductor memory device includes:

a memory cell array in which electrically rewritable floating gate type memory cells are arranged; and a plurality of sense amplifier circuits configured to read data from the memory cell array, wherein each the sense amplifier circuit is configured to sense cell data of a first memory cell selected from the memory cell array under a read condition determined in correspondence with cell data of a second memory cell adjacent to the first memory cell and written after the first memory cell.

DETAILED DESCRIPTION OF THE EMBODIMENTS

Figure 1:
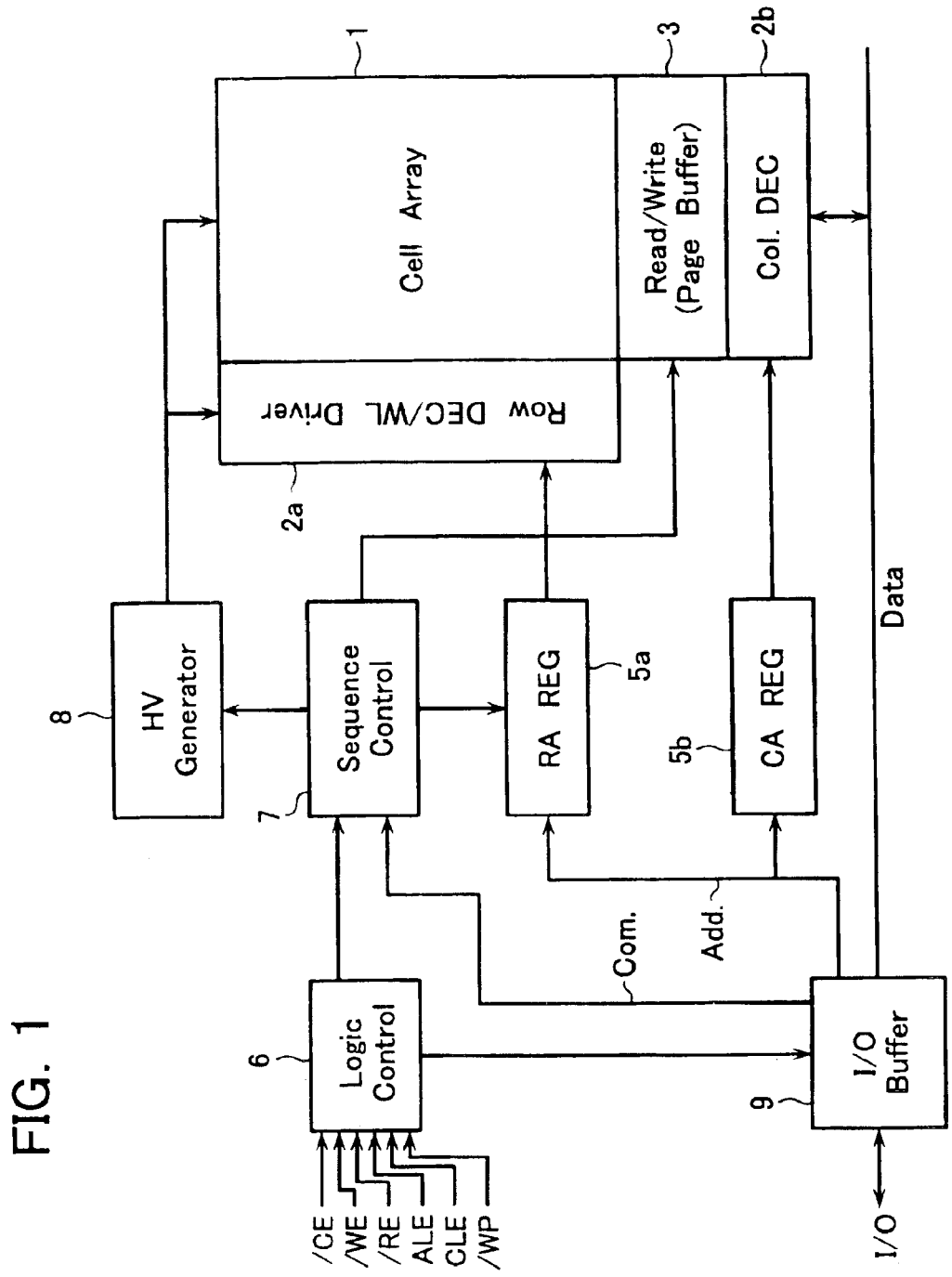
FIG. 1 shows a flash memory according to an embodiment of the present invention.

Referring to the drawings, embodiments of the present invention will be described bellows.

[EMBODIMENT 1]

FIG. 1 shows a circuit architecture of flash memory according to an embodiment of the present invention. A memory cell array 1 is, as described later, configured to have a plurality of floating gate type memory cells as being arranged in a matrix manner. A row decoder/word line driver 2a is prepared to drive word lines and select gate lines of the memory cell array 1. A read/write circuit 3 serves as a page buffer with sense amplifier circuits and data hold circuits for one page, which is used for data reading and data writing for each one page of the memory cell array 1.

One page read data of the page buffer 3 is sequentially selected by a column decoder 2b to be output to external I/O terminals through an I/O buffer 9. Write data supplied from the I/O terminals are selected by the column decoder 2b to be loaded in the page buffer 3. In the page buffer 3, loaded are write data for one page.

Row and columns address signals are input through I/O buffer 9 to be transferred to row decoder 2a and column decoder 2b, respectively. Row address register 5a holds erase block address in an erase mode, and page address in read and write modes. Into column address register 5b, the head column address is input, which is used for write data loading prior to data write operation, or for data reading. Column address register 5b holds input column address until when write-enable signal /WE or read-enable signal /RE is toggled under a certain condition.

Logic controller 6 controls for command inputting, address inputting and data inputting/outputting in response to chip enable signal /CE, command latch enable signal CLE, address latch enable signal ALE, write enable signal /WE, read enable signal /RE and the like. Read and write operations are performed due to command. In response to command, a sequence controller 7 executes read control and sequence control of data write and data erase. A high voltage generator 8 is controlled by the controller 7 to output predetermined voltages necessary for many kinds of operations.

Figure 2:
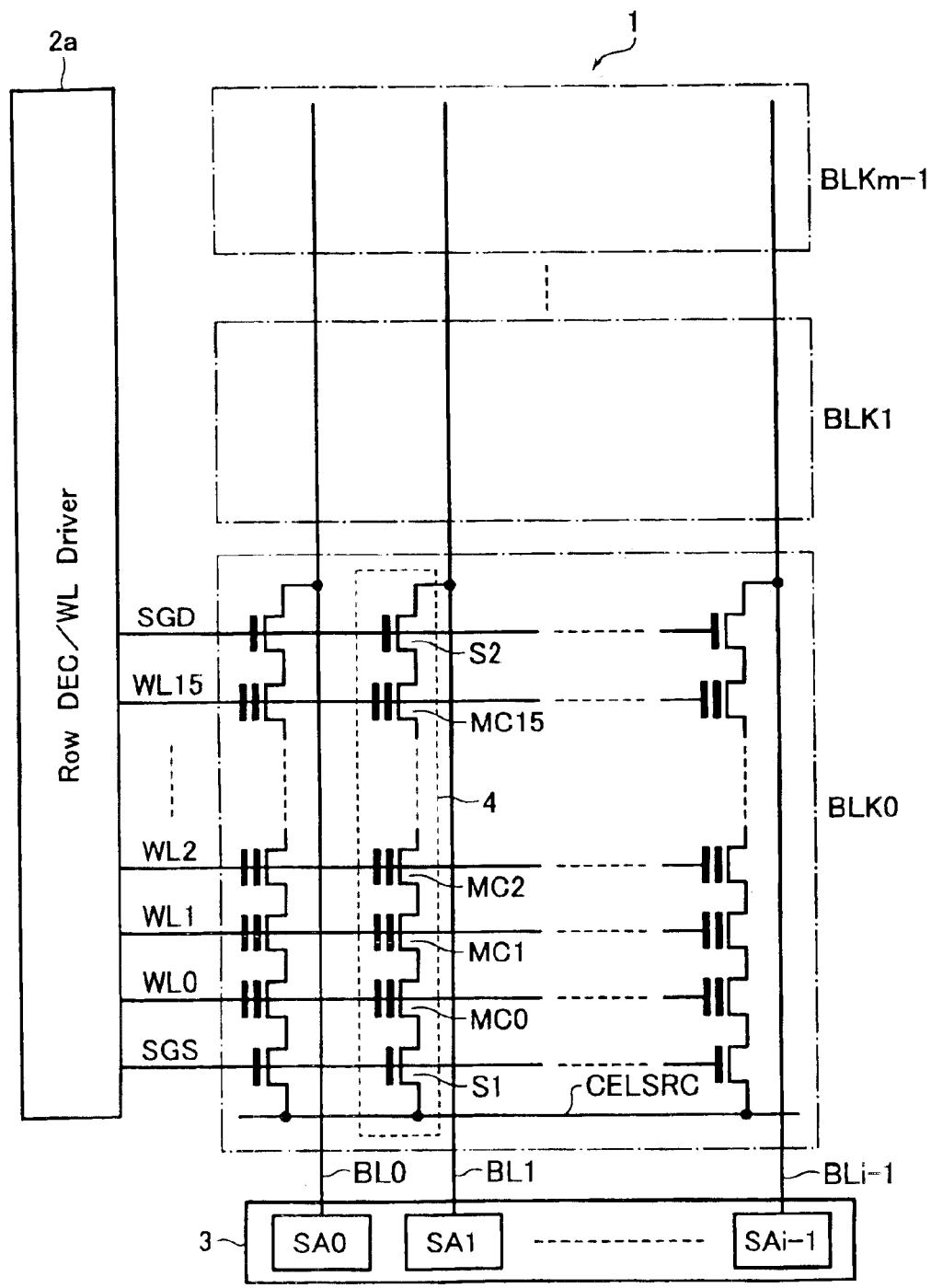
FIG. 2 shows a memory cell configuration of the flash memory.

FIG. 2 shows a detailed configuration of the cell array 1. In this example, sixteen memory cells MC0–MC15 serially connected, and select gates S1 and S1 connected to both ends thereof constitute a NAND cell unit 4. Sources of the respective select, transistors S1 are connected to a common source line CELSRC, and drains of the respective select transistors S2 are connected to bit lines BL (BL0-BLi-1), respectively. Control gates of the memory cells MC0–MC15 are connected to word lines WL (WL0–WL15), respectively, and gates of the select transistors S1 and S2 are connected to select gate lines SGS and SGD, respectively.

A region of plural memory cells arranged along one word line becomes one page serving as a unit for data reading and data writing at a time. A region of plural NAND cell units arranged in the direction of word lines constitute a cell block, BLK, serving as a unit for data erasing at a time. In FIG. 2, a plurality of cell blocks, BLK0, BLK1, . . . , BLKm−1, are arranged in the direction of the bit lines so as to share the bit lines, thereby constituting the cell array 1.

The word lines WL and the select gate lines SGS, SGD are driven by the row decoder 2a. The bit lines BL are connected to sense amp circuits SA (SA0-SAi−1) in the page buffer 3, respectively.

Figure 3:
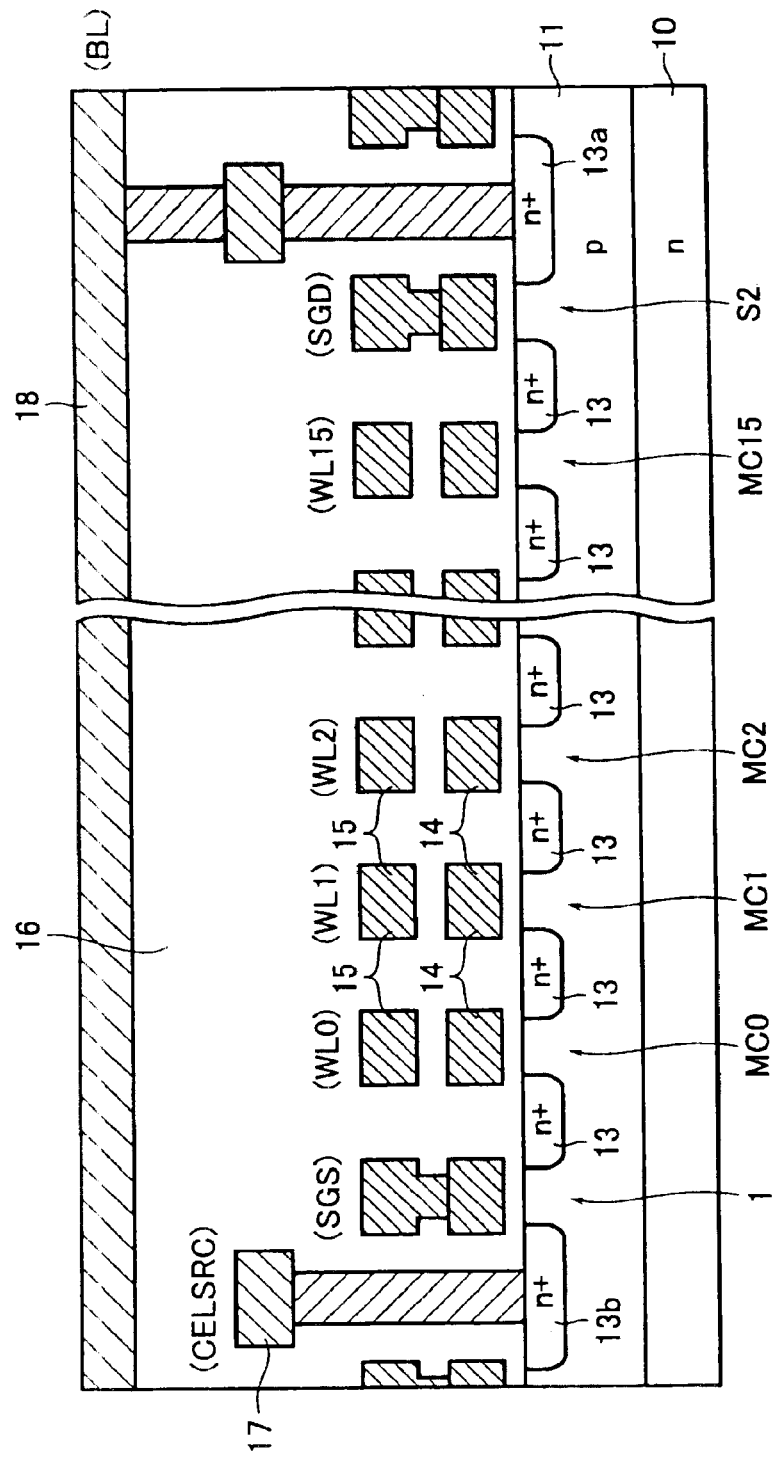
FIG. 3 shows a sectional view of a NAND cell unit of the flash memory.

FIG. 3 shows a sectional view of the NAND cell unit taken along the bit line. Memory cells are formed on a p-type well 11 in an n-type silicon substrate (or n-type well) 10. The memory cells are formed so as to share the source/drain diffusion layers by the respective adjacent cells, and to have stack structures of floating gates 14 and control gates 15. The control gates are patterned to be word lines WL commonly connected to plural memory cells arranged perpendicular to the face of this figure. The cell array is covered by an interlayer dielectric layer 16. Source line (CELSRC) 17, which is buried in the interlayer dielectric layer 16 and commonly used in a cell block, is connected to a source diffusion layer 13b of one select transistor S1. Bit line (BL) 18 formed on the interlayer dielectric layer is connected to a drain diffusion layer 13a of the other select transistor S2. Contacts of the source line 17 and bit line 18 are shared by adjacent cell blocks.

As described above, in the NAND type flash memory, adjacent two memory cells share source/drain diffusion layers, and adjacent two cell blocks share wiring contacts. Although detailed explanations are omitted, in the direction perpendicular to the face of FIG. 3, alternately disposed are device regions and device isolating regions with a stripe pattern. Memory cells are disposed at the crossing points of the device regions and the word lines WL with a stripe pattern. Based on such a structural characteristic, it is easy to form a NAND type flash memory with a high density and a large capacity. In practice, a unit cell area of $5F^2$ (F: minimum device-feature size) may be substantially achieved.

Figure 4:
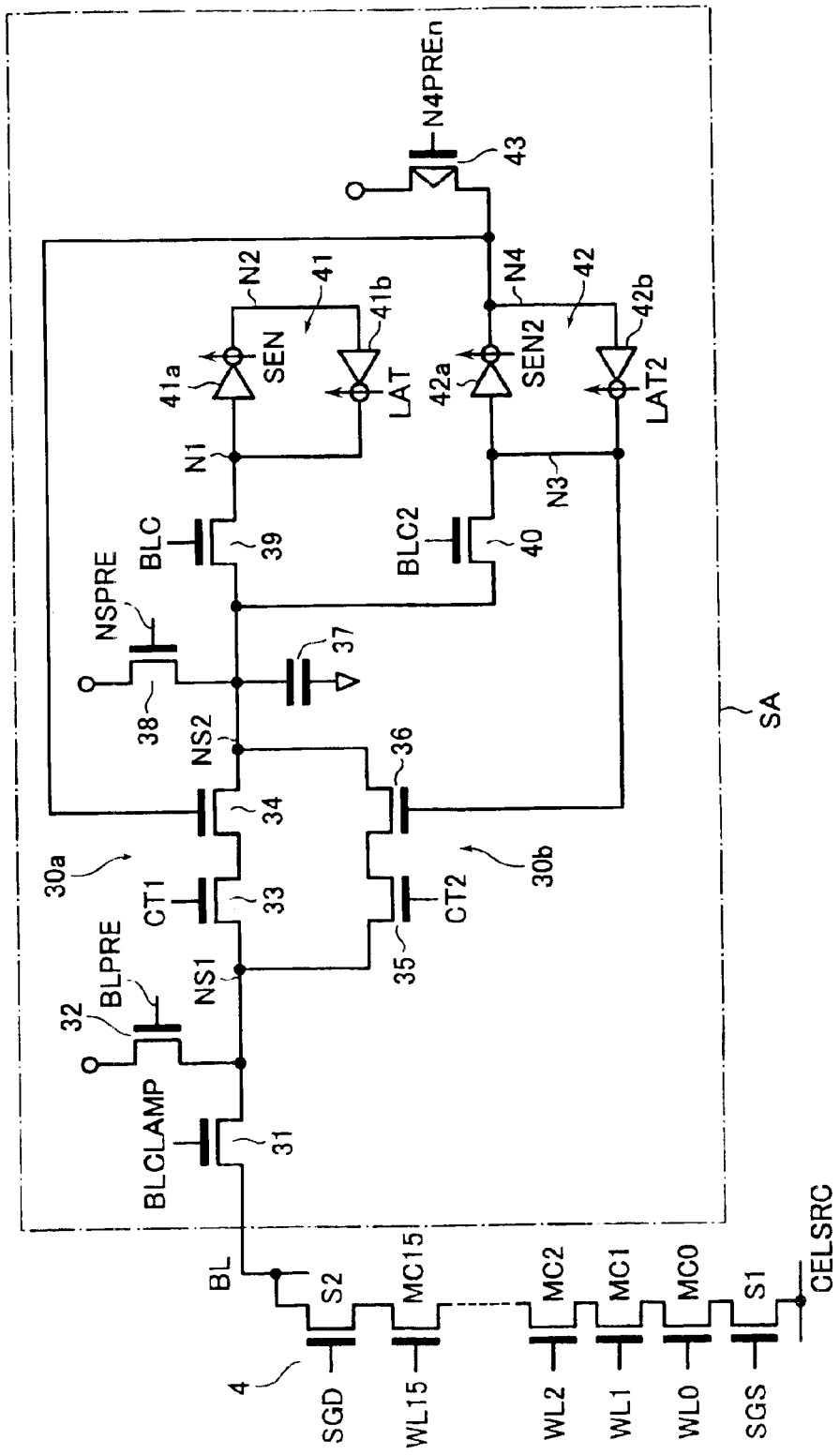
FIG. 4 shows a sense amp circuit of the flash memory.

FIG. 4 shows a NAND cell unit 4 and a configuration of the sense amp circuit SA to which a bit line BL connected to the NAND cell unit 4 is connected. The bit line BL is connected to plural NAND cell units as described above, but only one unit is shown in FIG. 4. The sense amp circuit SA has two latch circuits 41 and 42. First latch circuit 41 is configured by two clocked inverter 41a, 41b connected in parallel in the reverse direction. Similarly, second latch circuit 42 is configured by two clocked inverter 42a, 42b connected in parallel in the reverse direction.

One node N1 within data nodes N1 and N2 of the first latch circuit 41 is connected to a sense node NS2 through a transfer NMOS transistor 39 driven by a control signal BLC. One node N3 within data nodes N3 and N4 of the second latch circuit 42 is connected to the same sense node NS2 through a transfer NMOS transistor 40 driven by a control signal BLC2. A PMOS transistor 43, gate of which is driven by a control signal N4PREn, is connected to the node N4 for initializing its potential to be Vcc.

The first latch circuit 41 is used for data reading for a cell under notice. The second latch circuit 42 is used for holding a read data of a cell, which is disposed adjacent to the cell under notice to influence the read data of the cell under notice, as a reference data.

The sense node NS2 is connected to another sense node NS1 disposed near to the bit line through a data transfer circuit 30a with two NMOS transistors 33, 34 as serially connected for transferring a bit line data. Further disposed between the sense nodes NS2 and NS1 is another data transfer circuit 30b which is configured by two NMOS transistors 35, 36 serially connected.

These two transfer circuits 30a and 30b are prepared for selectively transferring one of cell data under different read conditions for a noticed cell to the first latch circuit 41. In other words, the transfer circuits 30a and 30b are switched in such a manner that one is in an on-state and the other an off-state in response to the reference data held in the second latch circuit 42. In detail, NMOS transistors 34, 36 are gate-controlled by the nodes N4, N3 of the latch circuit 42, respectively. NMOS transistors 33, 35 are controlled by data sense-use control signals CT1, CT2, respectively. The control signals CT1 and CT2 are generated at different timings from each other when data sensing is performed for the noticed cell.

The sense node NS1 is connected to the bit line BL through a clamp NMOS transistor 31 controlled by a control signal BLCLAMP. This transistor 31 is adapted for bit line potential controlling, and for amplifying the bit line potential in a read mode. Connected to the sense node NS1 is an NMOS transistor 32 which is driven by a control signal BLPRE to precharge the bit line BL. Connected to the sense node NS2 are an NMOS transistor 38 which is driven by a control signal NSPRE to precharge the node NS2, and a capacitor 37 for holding the charged potential of the node NS2.

Figure 5:
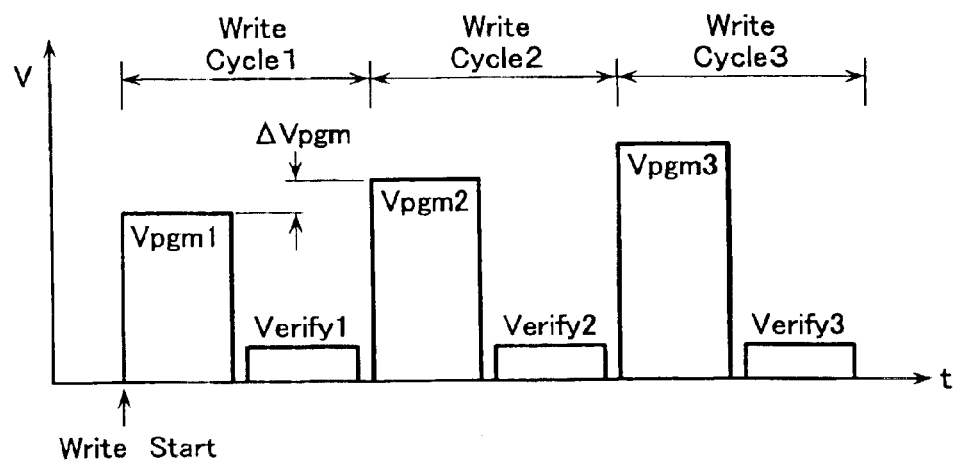
FIG. 5 shows a principle of data write operation of the flash memory.

Data writing of the flash memory according to this embodiment is performed, as shown in FIG. 5, with a plurality of write cycles in which write pulse applications and verify reads thereafter are repeated. The write pulse voltages, Vpgm, are stepped up by ΔVpgm for each write cycle, as shown in FIG. 5. The sense amp circuit SA shown in FIG. 4 is used as a write circuit which holds write data until write cycles are ended and performs the above-described data writing. Note that a circuit portion serving for judging the data write end by verify read operation is omitted in FIG. 4.

Figure 6:
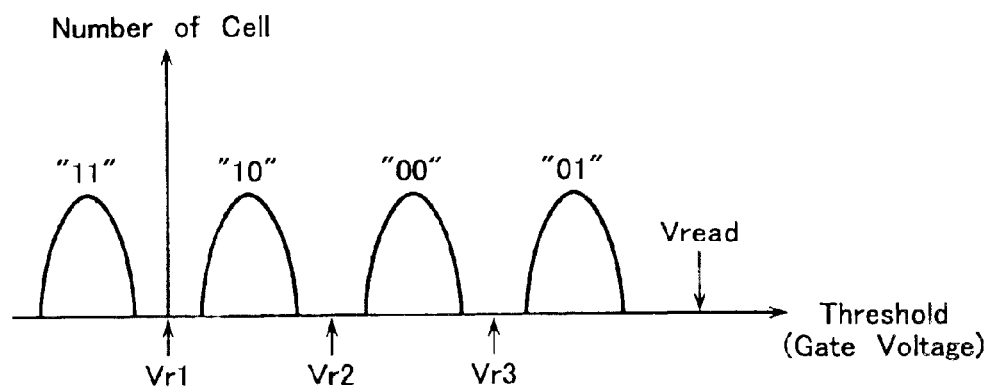
FIG. 6 shows an example of data distribution of the flash memory.

In this embodiment, it is assumed that 4-value data "00", "01", "10" or "11" is written with threshold distributions as shown in FIG. 6. In a case that the above described 4-value data is written, the influence of the above-described interference from neighboring cells becomes larger than a case of binary data storing.

Figure 7:
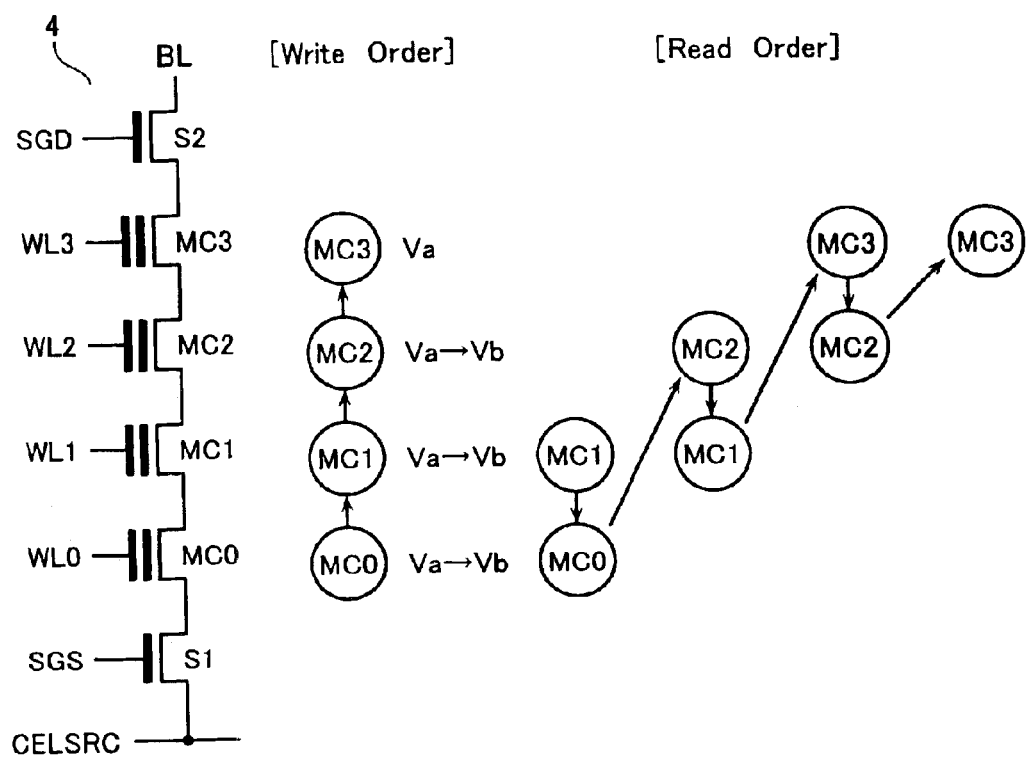
FIG. 7 shows a write order and a read order in the NAND cell unit of the flash memory.

Next, a data read scheme according to this embodiment, which is able to reduce the influence of the interference from adjacent cells, will be described. FIG. 7 shows a data write order and a data read order according to the embodiment by giving attention to a NAND cell unit 4. In FIG. 7, for the purpose of simplifying the explanation, it is shown that the NAND cell unit 4 is formed of four memory cells MC0–MC3. Data write is done in order from the memory cell MC0 at the source line CELSRC side toward the memory cell MC3 at the bit line BL side. Therefore, threshold Va of the written memory cell is changed to Vb by the interference from the neighboring memory cell into which data write is done later.

To reduce such an influence of the interference from the adjacent cell, data read operation is performed as follows. When memory cell MC0 is subjected to data read, the read condition is determined corresponding to a read data of the memory cell MC1 which is disposed adjacent to the memory cell MC0 and written after the memory cell MC0. Similarly, when memory cells MC1, MC2 are read, the read conditions are determined corresponding to read data of the memory cells MC2, MC3, respectively, which are disposed adjacent to the memory cells MC1, MC2 and written after the memory cells MC1, MC2, respectively. The memory cell MC3 disposed at the most near point to the bit line BL is read as it is, because there are no cells to be written later.

Figure 8:
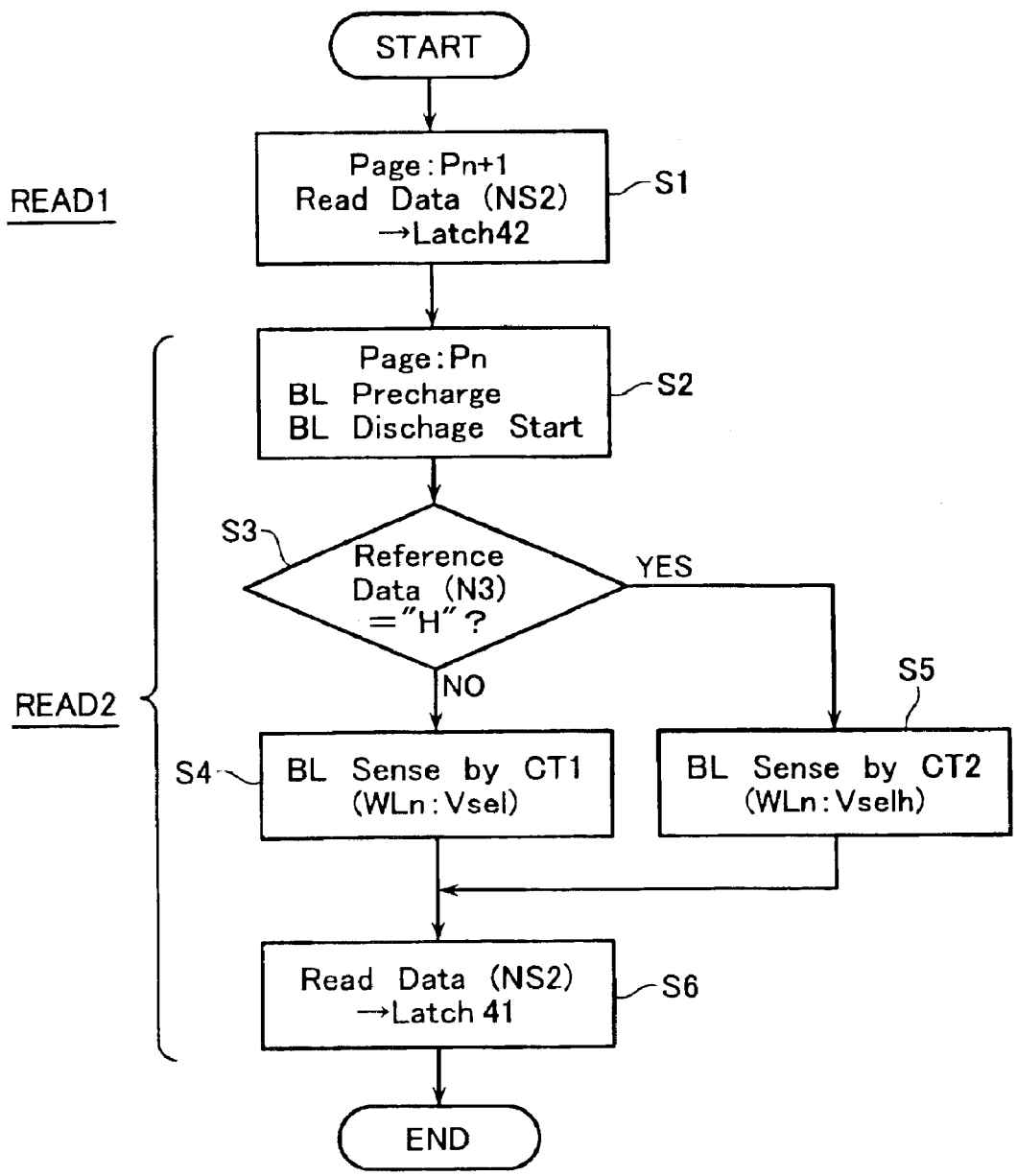
FIG. 8 shows a flow of data read operation of the flash memory.

FIG. 8 shows a flow of the page read operation. Two data read operations READ1 and READ2 are performed as follows: the former is for a page, read data of which is to be a reference data; and the latter is for a noticed page. In detail, when page Pn (i.e., word line WLn) is selected, data influencing the read data of page Pn is that of page Pn+1 (i.e., word line WLn+1). Therefore, when data read of page Pn is demanded by address input from outside of the chip, data read for page Pn+1 is initially performed (at step S1). Each the read data is held as a reference data in the second latch circuit 42 of the sense amp circuit SA shown in FIG. 4.

Thereafter, data read READ2 for the noticed page Pn is performed. In detail, after the bit lines have been precharged, the bit line discharge is started (at step S2). A bit line sensing condition is to be set corresponding to the reference data which has previously been read out. For the purpose of this, judge whether the node N3 of the latch circuit is "H" or not (at step S3). If the node N3 is "H", it is required for considering the interference of the adjacent cell for the select page read. If not so, there are no such needs. In practice, this judgment is presented as a result that one of the data transfer circuits 30a, 30b becomes effective corresponding to the reference data of node N3 of the second latch circuit 42 in the sense amp circuit SA.

In detail, if the judged result is "NO" at the step S3, data sense is performed by the data transfer circuit 30a which is driven by the control signal CT1 to be in an on-state (at step S4). During this data sense, read voltage Vsel is applied to the word line WLn of the select page. If the judged result is "YES" at the step S3, data sense is performed by the data transfer circuit 30b which is driven by the control signal CT2 to be in an on-state (at step S5). During this data sense, read voltage Vselh, that is slightly higher than Vsel, is applied to the word line WLn of the select page. One of the read out data sensed by CT1 and CT2 for the select page is selectively transferred to the first latch circuit 41 (at step S6).

Figure 9A:
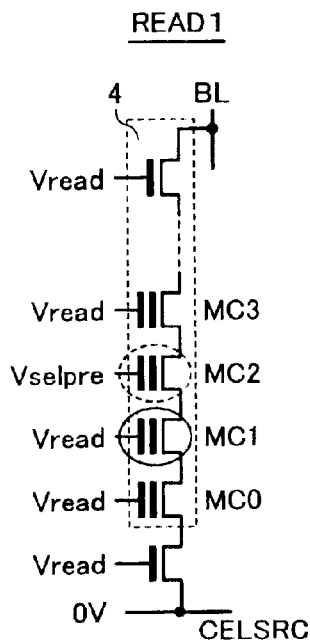
FIGS. 9A and 9B show bias conditions of reference data read and data read for a cell under notice of the flash memory, respectively.
Figure 9B:
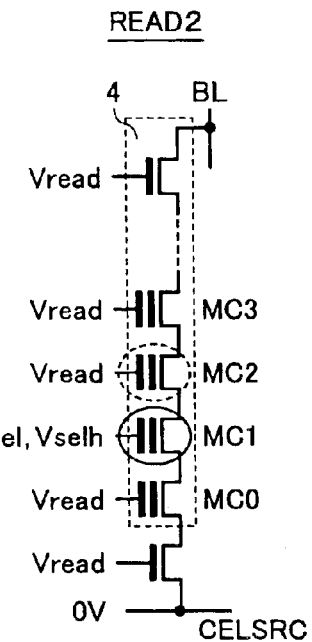

FIGS. 9A and 9B show bias conditions for the NAND cell unit in the read operations READ1 and READ2. Assume that memory cell MC1 is to be read in the select page Pn, and a read voltage Vselpre is applied to the word line of the neighboring memory cell MC2 in the read operation READ1. Applied to the remaining word lines and select gate lines is a pass voltage Vread which turns on the memory cells and the select gate transistors driven by it.

The read voltage Vselpre is one that serves for judging whether the memory cell MC2 of page Pn+1 is written into a certain threshold voltage state or not. For example, to judge whether the cell data is at the data "11" or not in FIG. 6, Vselpre is set at Vr1(=0V). When the read voltage Vselpre is set at Vr2, it will be determined whether the cell data threshold is lower than that of data "10" or higher than that of data "00".

In the read operation READ2 for the noticed page, as shown in FIG. 9B, different read voltages Vsel, Vselh are applied to the selected word line at the different timings, respectively. These serve as the different read conditions corresponding to the reference data. To non-select word lines and the select gate lines, the pass voltage Vread is applied.

Figure 11:
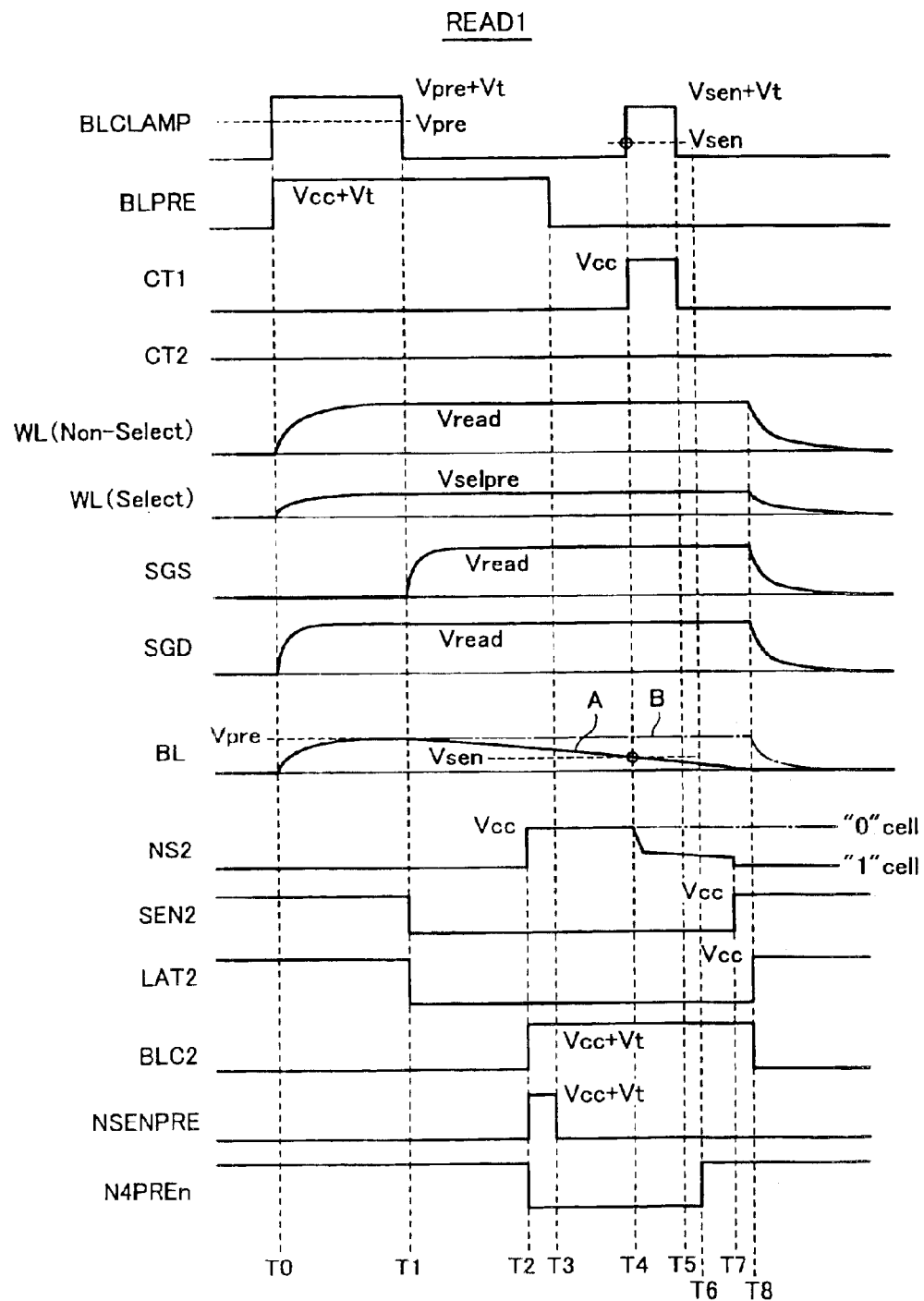
FIG. 11 shows waveforms of reference data read operation of the flash memory.
Figure 12:
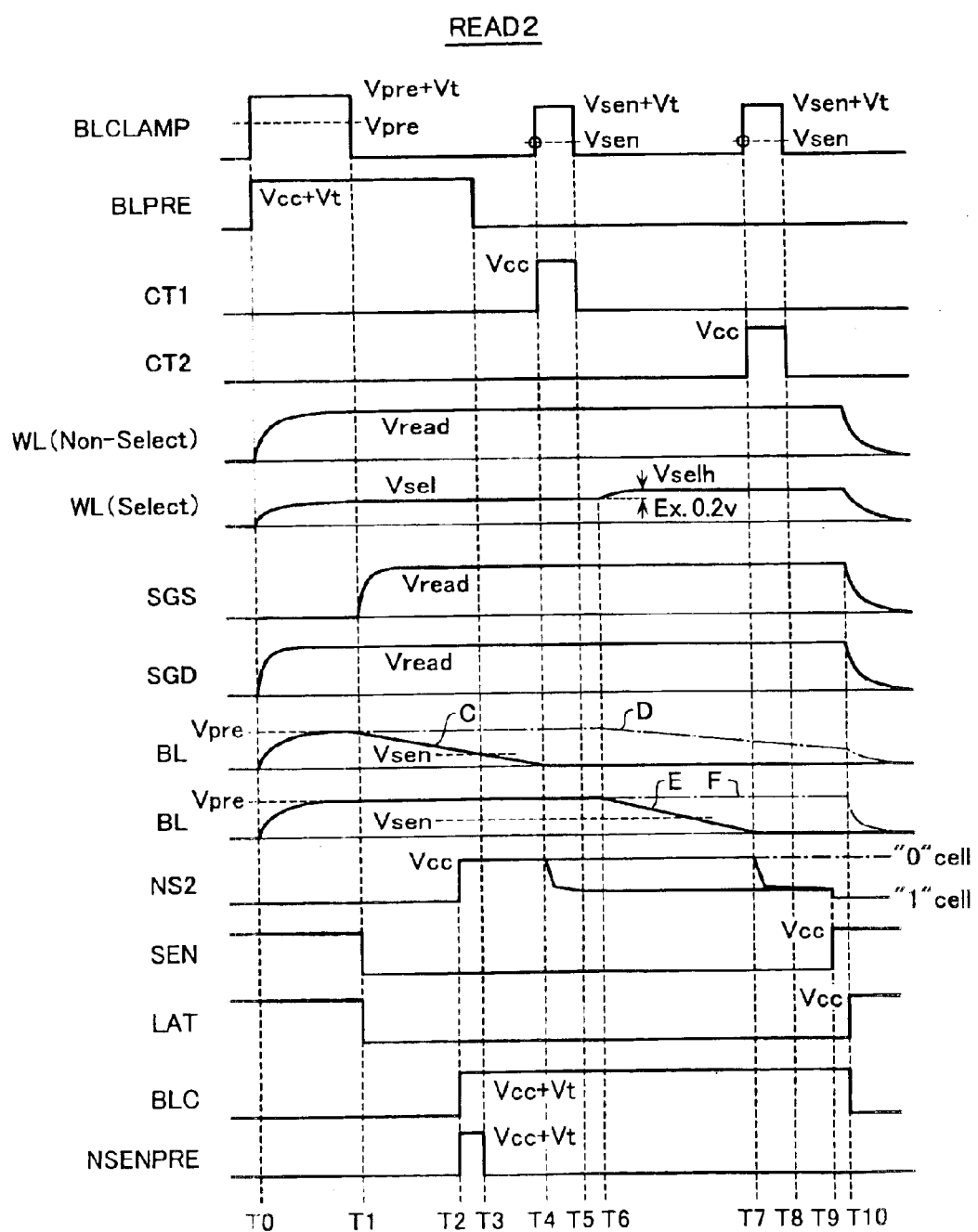
FIG. 12 shows waveforms of data read operation for the cell under notice of the flash memory.

Next, referring to FIGS. 11 and 12, the read operation will be described in detail further. FIG. 11 shows operation waveforms in the read operation READ1 for reading the reference data of page Pn+1. FIG. 12 shows operation waveforms in the read operation READ2 for reading data of noticed page Pn.

The read operation of FIG. 11 is as follows. Apply certain voltages to word lines and select gate lines from timing T0 to T1, and bit lines are precharged. In detail, read voltage Vselpre is applied to the selected word line, and pass voltage Vread to the non-selected word lines and select gate line SGD at the bit line side. Bit line precharge is done by applying Vcc+Vt to the gate BLPRE of the NMOS transistor 32 so as to set the node NS1 be Vpre+Vt, and by applying Vpre+Vt to the gate BLCLAMP of the NMOS transistor 31. Whereby, the bit lines are precharged to Vpre.

At timing T1, the pass voltage Vread is applied to the select gate line SGS at the source line CELSRS side. If having a threshold lower than Vselpre, the memory cell of page Pn+1 (i.e., memory cell MC2 in FIG. 9A) becomes on, thereby discharging the bit line potential Vpre. In contrast, if the threshold is higher than Vselpre, the bit line is not discharged. In FIG. 11, a solid line A in the bit line waveforms shows a case that the bit line is discharged, and a dotted line B shows another case that the bit line is not discharged.

From timing T2 to T3, turn on the NMOS transistor 38, and the sense node NS2 in the sense amp circuit SA is precharged at Vcc. Simultaneously, Vcc+Vt is applied to the gate BLC2 of NMOS transistor 40 for transferring read data to the latch circuit 42. As s result, node N3 also is precharged at Vcc. From timing T4 to T5, bit line sense voltage Vsen+Vt (Vt; threshold voltage of NMOS transistor 31) is applied to the gate BLCLAMP of NMOS transistor 31. At the same time, to the gates of NMOS transistor 33, the control signal CT1=Vcc is applied.

During timings T2–T6, the gate of PMOS transistor 43 is driven by N4PREn="L", whereby Vcc is applied to the gate of NMOS transistor 34. Therefore, at this dada sensing time, only the data transfer circuit 30a is in a data transmissible state. The sense voltage applied to the gate BLCLAMP of NMOS transistor 31 is Vsen+Vt (Vt: threshold voltage of transistor 31). If bit line potential is lower than Vsen, as shown by bit line waveform A, NMOS transistor 31 is turned on, thereby discharging the nodes NS1, NS2 to near the bit line potential. In this case, "L" data is sensed and stored in the node N3 of the latch circuit 42 from timing T6 to T7. This means that the memory cell of page Pn+1 is not written, or written into a data state with threshold variation thereof being little.

In the case that bit line potential is not discharged during T1 to T4, as shown by bit line waveform B, "H" data is stored in the node N3 of the latch circuit 42. This means that the memory cell of page Pn+1 is written into a data state which is to affect the write data into the memory cell of the noticed page Pn. During timings T7–T8, data of the node N3 is stored in latch circuit 42. So far, the reference data is stored in the second latch circuit 42.

While the latch circuit 42 is holding the reference data, the data read operation READ2 for the selected page Pn is performed as shown in FIG. 12. In this read operation, voltages applied to the NAND cell unit is as shown in FIG. 9B. In FIG. 9B, it is assumed that memory cell MC1 is that of page Pn. To the word line for selecting the cell MC1, applied are two read voltages Vsel, Vselh at different timings. These read voltages Vsel, Vselh correspond to Vr2, Vr2h in FIG. 10, respectively, in the case that this data read is performed for distinguish data "10" from data "00" in FIG. 10. Vr2 is a read word line voltage used in the case that page Pn+1 is not written, and Vr2h is a read word line voltage used in the case that page Pn+1 has been written.

From timing T0 to T1, apply a read voltage Vsel (for example, Vr2) to the selected word line, apply a pass voltage Vread to non-selected word lines and a select gate line SGD in the same NAND cell unit, and the bit line is precharged to Vpre. At timing T2, apply the pass voltage Vread to the select gate line SGS at the source line CELSRC side, and the bit line may be discharged as shown by bit line waveform C in a case that the threshold of memory cell MC1 of the select page Pn is lower than Vsel.

During T2–3, apply Vcc+Vt to the gates NSPRE, BLC of NMOS transistors 38, 39, and the node NS2 and node N1 of the latch circuit 41 are precharged to Vcc. The sense node precharge by the NMOS transistor 38 is stopped at timing T3, but Vcc+Vt is continuously applied to the gate of NMOS transistor 39. Between timing T4 to T5, sense voltage Vsen+Vt and control signal CT1=Vcc are applied to the gates of NMOS transistors 31 and 33, respectively.

At this time, if the reference data held in the latch circuit 41 is: N3="L", N4="H", i.e., the memory cell of page Pn+1 is not written, the NMOS transistor 34 is gate-driven by Vcc to be in a transmissible state. That is, the transfer circuit 30a becomes active, thereby sensing the bit line during T4–5. In the case that bit line potential is lower than Vsen as shown by a solid line waveform C, nodes NS1, NS2 are discharged by the bit line. If bit line has not been discharged, nodes NS1, NS2 are not discharged as shown by a dotted line D. As described above, the result of the bit line sensing is transferred to the node N1 of the latch circuit 41.

Figure 10:
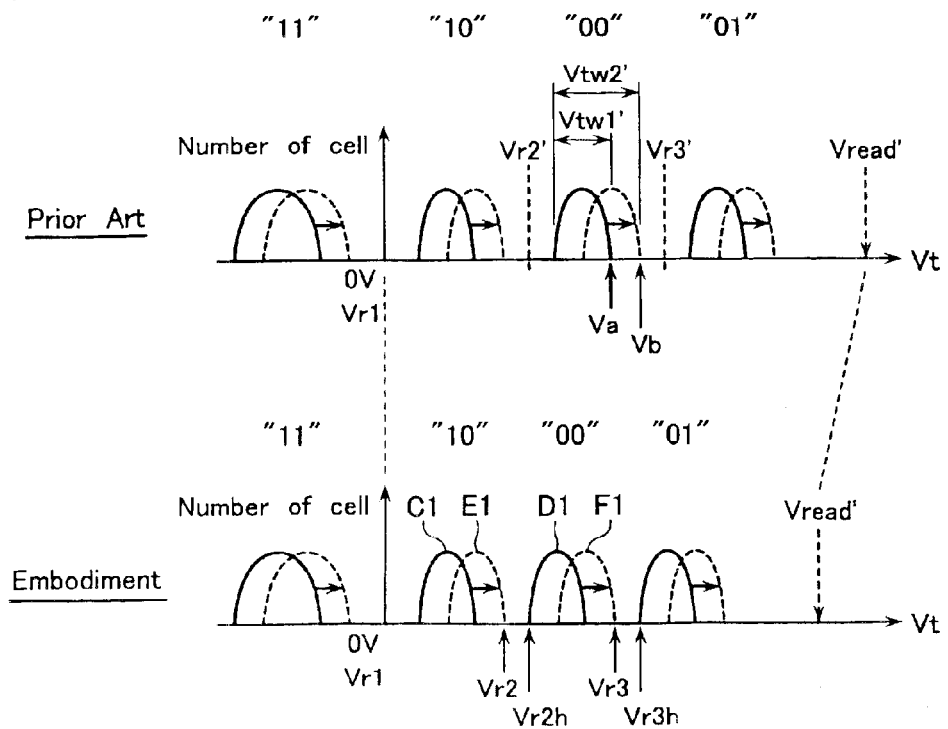
FIG. 10 shows a data state of the flash memory in comparison with the prior art.

The memory cell thresholds due to the bit line discharge waveforms C and D correspond toga solid line distribution C1 of data "10" and another solid line distribution D1 of data "00", respectively, in the data distributions shown in FIG. 10. These distributions C1, D1 show the threshold distributions in the case that there are no influences from the written data in the adjacent cell. Therefore, by the data sensing during T4 and T5, these distributions C1 and D1 are distinguished, because the reference data held in the latch circuit 42 teaches that the data of page Pn+1 does not affect the memory cell data of noticed page Pn.

Next, at timing T6, boost the read word line voltage for the selected page Pn to Vselh. The bit line discharge operation continues as it is. A maximum of the difference between Vselh and Vsel is set as corresponding to the potential difference between the solid line distribution C1 (without influence by adjacent cell) and a dotted line distribution E1 (with influence by adjacent cell) in FIG. 10. One example is taken as: Vselh=Vsel+0.2(V). After waiting almost the same period as that of bit line discharge from T1 to T4, bit line sensing is performed again during T7–T8.

At this time also, the voltage applied to the gate BLCLAMP of NMOS transistor 31 is set at Vsen+Vt. At the same time, the control signal CT2=Vcc is applied to the gate of NMOS transistor 35. The bit line sense performed during this period is for the memory cell which has a threshold as expressed by dotted line distribution E1 or F1 as sown in FIG. 10. These are memory cells each threshold of which is shifted from the solid line distribution C1 or D1 to the dotted line distribution E1 or F1 by influence of the adjacent memory cell as a result of that memory cell of page Pn+1 is written into a certain data state, as sown in FIG. 10.

In this case, since the data held in the latch circuit 42 is N3="H", N4="L", NMOS transistor 36 is in a transmissible state. Therefore, if bit line potential has been lower than Vsen at timing T7 as shown by dotted line waveform E, the sense node NS2 is discharged through the transfer circuit 30b and through NMOS transistor 31 by the bit line. If the bit line is not discharged as shown by waveform F, it is appreciated that the memory cell threshold is higher than the read voltage Vr2h as shown by a threshold distribution F1 in FIG. 10.

As described above, either one of the sensed results, which are sensed at the timings T4–T5 and T7–T8 under the different read conditions, is stored in the latch circuit 41 by control signals SEN, LAT as becoming "H" in order at timings T9 and T10.

In the above-described embodiment, although it is not explained how two bits of 2-bit/cell data are distinguished, it is possible to read plural threshold distributions of multi-value data on condition that the word line voltage is switched for the respective data. In detail, to distinguish the two bits, some schemes may be used corresponding to the assignment of the two bits to data as follows: in one case, it is required for repeating data read operation three times; and in another case, it needs only read one or two times. The former is a case in which 2-bit/cell are assigned to two I/Os, or two column addresses, and the latter is a case in which 2-bit/cell are assigned to two row addresses. This embodiment is to improve one data read operation in the above-described read modes. Therefore, the data stored in the latch circuit 41 by the read operation of FIG. 12 is 1-bit data of 2-bit/cell, or a medium data in the course of 2-bit/cell reading. On the other hand, the data stored in the latch circuit 42 becomes a reference data for precisely determining the read data to the latch circuit 41. Therefore, perform the above-described data read operation once or plural times, and a final data to be output to outside of the chip will be determined.

The merit of this embodiment will be apparent from FIG. 10 in which the data threshold distribution of this embodiment is shown in comparison with that of the prior art. The prior art in FIG. 10 shows a case that the influence between cells is large so as to widen the data threshold distributions, and it corresponds to the case of FIG. 23. In the prior art, it is required for setting the word line read voltages, Vr2, Vr3 corresponding to the widened threshold distributions. In contrast to this, by applying the read method according this embodiment in which one of the read voltages Vr2, Vr2h is selectively used corresponding to whether the influence between neighboring cells exists or not, it is possible to make the threshold distributions narrow as shown at the lower side in FIG. 10. This is effective especially for performing multi-value data storing. In accordance with this embodiment, it is able to not only suppress a vicious cycle that is generated by widening the write threshold distributions in consideration of the influence between the neighboring cells, but also reduce the stress in the non-selected cells to which the read-use pass voltage Vread is applied.

In the read method of this embodiment, when data read is performed sequentially from source line side, the read operation of page Pn that is demanded from outside of the chip is accompanied with the read operation of page Pn+1. In addition, it is required for bit line sensing at twice by use of the control signals CT1, CT2, during data read of page Pn, as apparent from FIG. 12. As a result, the data read period becomes about two times and a half as long as that of the prior art. In view of the fact, this embodiment will become effective in a case that write speed has to be given priority over the read speed.

[EMBODIMENT 2]

Figure 13:
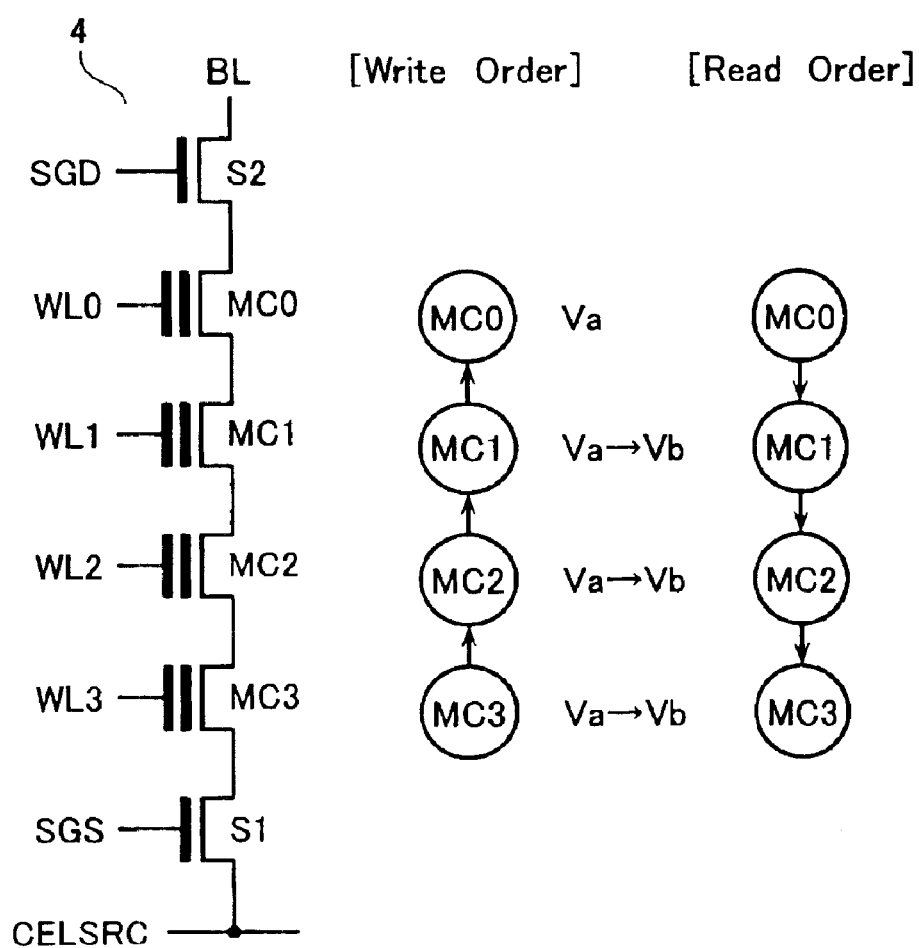
FIG. 13 shows a write order and a read order in the NAND cell unit of a flash memory according to another embodiment.

FIG. 13 shows a write order and a read order according to the embodiment 2 in comparisons with that of the embodiment 1 shown in FIG. 7. In this embodiment, the write order is reversed to the read order in the NAND cell unit. As a result, it is possible to omit the read operation READ1 of page Pn+1 which is required for read operation READ2 of page Pn in the embodiment 1. In detail, read the NAND cell unit 4 in the reverse order, and data read out just before the noticed cell becomes to serve as a reference data for performing a read operation similar to that in the embodiment 1 as shown in FIG. 12.

In FIG. 13, memory cells MC0–MC3 driven by word lines WL0–WL3, respectively, are disposed, to which page addresses are assigned in a page address order from the bit line BL side. Page write operation in the NAND cell unit 4 is usually performed in address order from the lowest address (i.e., in order of WL0, WL1, WL2 and WL3). On the contrary, in this embodiment, page write is performed in order from the uppermost address (i.e., in order of WL3, WL2, WL1 and WL0). Giving attention to memory cells, the write order becomes as from MC3 to MC0.

In contrast to this, the read order in a continuous page read is set as in order of WL0, WL1, WL2 and WL3. Giving attention to memory cells, the read order becomes as from MC0 to MC3. In such the read operation, memory cell MC0, which is written after memory cell MC1 and influence the read data of memory cell MC1, is read out just before the memory cell MC1. Therefore, the read condition of the memory cell MC1 may be determined by use of the read out data of memory cell MC0 as a reference data. Similarly, the read conditions of memory cells MC2, MC3 may be determined by the read data of memory cells MC1, MC2 which are read just before memory cells MC2, MC3, respectively. Memory cell MC0 is not influenced by the neighboring cell as similar to the embodiment 1.

Figure 14:
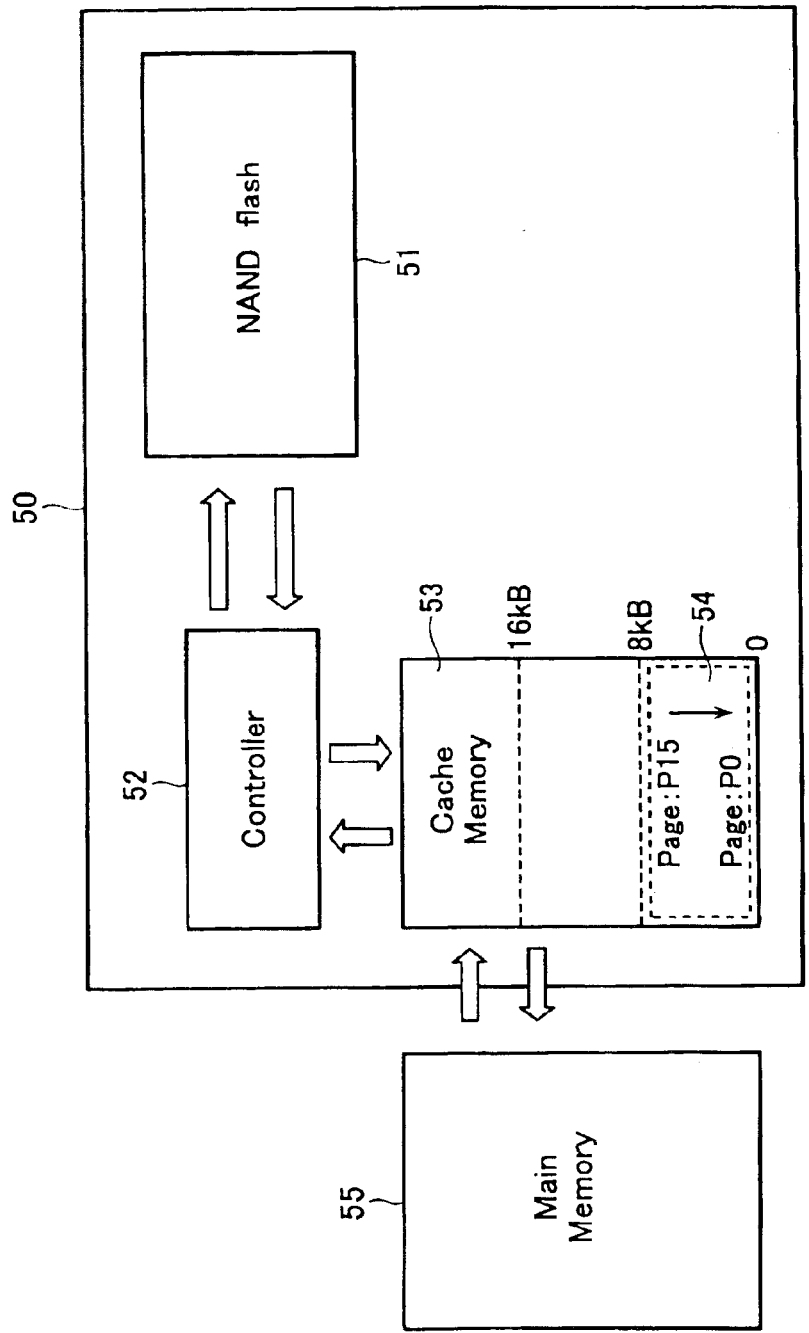
FIG. 14 shows a memory system to which the embodiment is applied.

In order to invert the write order so as to be contrary to the ordinary one in this embodiment, it is required of a system that to-be-written data for at least one cell block of the NAND type flash memory are temporarily stored, and then supplied it to the memory chip. FIG. 14 shows a schematic configuration of such a memory system. On the memory card 50 including a NAND type flash memory 51, installed are a controller 52 which controls data input/output of the NAND type flash memory 51 and a cache memory 53 which temporarily holds the data input to or output from the memory 51. The cache memory 53 has a memory capacity (memory space) equal to at least one cell block size of the NAND type flash memory 51 or more.

Main memory 55 is one in an electric device to which the memory card 50 is detachably connected. When data write is performed from the main memory 55 into the NAND type flash memory 51, to-be-written is input to the cache memory 53. Assuming that the to be written data is transferred to the cache memory 53 in order from the lowest page address, the data are stored in a memory region 54 of the cache memory 53 in the page address order from the head address page P0. In the case that the NAND cell unit consists of sixteen memory cells, i.e., one cell block consists of sixteen pages, the memory region 54 has a capacity consistent with the cell block size of the flash memory 51.

The data stored in the region 54 of the cache memory 53 is controlled as not covering plural cell blocks. After storing the to-be-written data for one cell block (16 pages) into the region 54, controller 52 controls to transfer the data to the NAND flash memory 51 and start data write thereof. In this case, to make the write order the same as that explained referring to FIG. 13, controller 52 controls to transfer and write the data stored in the region 54 in order from page P15 to P0. AS a result, data write order for the NAND type flash memory 51 becomes reversed to the ordinary one.

Figure 15:
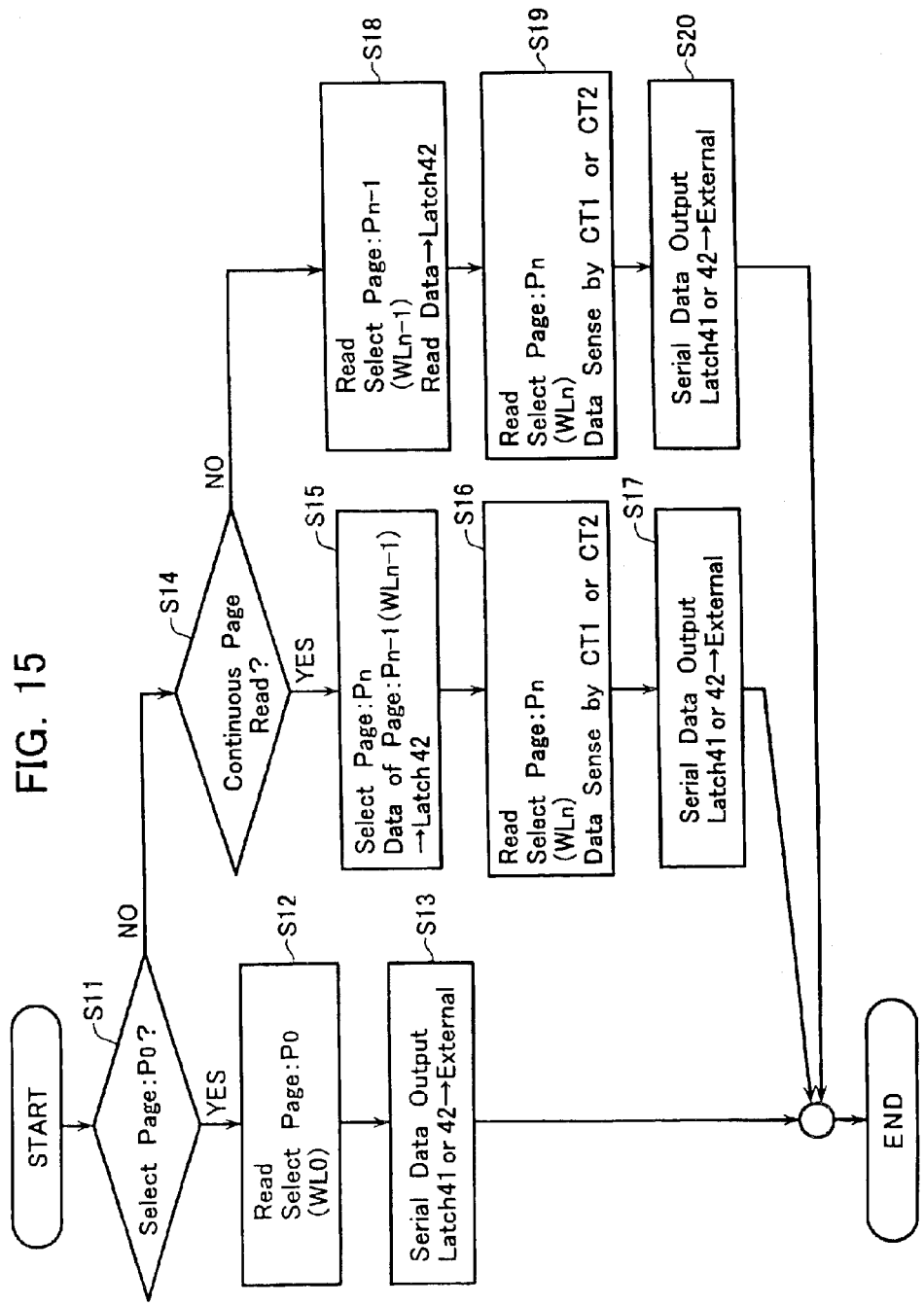
FIG. 15 shows a flow of data read of the flash memory according to the embodiment.

The condition of that the read period is shortened by reversing the write order to the read order as this embodiment is effective in a case that the page read operations are continuously performed in order from page P0. However, in a practical operation, there is a case in which it is necessary to rather read as similar to the embodiment 1 with a reference data read operation than continuously read in address order. Alternatively, there is also a case in which data read of a selected page is not affected from the neighboring cell. In consideration of the above-described all cases, FIG. 15 shows a flow chart of a read operation of a NAND type flash memory.

In this embodiment, when finally written data of page P0 in the NAND type flash memory 4 is read out, it is not required for considering the interference from the adjacent cell, and an ordinary read condition may be used. Therefore, at step S11, it is judged whether the external address is page P0 or not. If page P0 is selected, an ordinary data read is performed corresponding to the multi-value data of the memory cells at step S12. Although there are some kinds of data read schemes at this step S12 which are different corresponding to the data assignment to cells, it is appreciated that the read operation shown in FIG. 11 may be used. In detail, the read operation is an ordinary one without distinguishing the read timings by control signals CT1, CT2, and without alternating the word line voltage. Read data at this step may be stored in the latch circuit 41 or 42 in the sense amp circuit SA. Finally decided read data is output to outside of the chip at step S13.

In a case that an optional page Pn is selected for data reading in the cell block, it is judged whether page Pn−1 is read before the read of page Pn (i.e., whether selected pages are continuous or not) at step S14. In order to address judge as above described, it is required for controller 7 of the memory chip to store historical information for address selecting. If the selected addresses are sequential, go to step S15. At this step S15, assuming that read data of page Pn−1 is stored in the latch circuit 41 of the sense amp circuit SA, the read data is transferred to the latch circuit 42 as a reference data.

At step S16, multi-value data of the memory cell is read out under the read condition determined based on the reference data held in the latch circuit 42 as similar to that shown in FIG. 12 in the embodiment 1. At step S17, the decided read data is output to outside of the chip at step S13.

In a case that the data read is to an optional page Pn rather than the continuous page read, data read operation is performed for reading out a reference data as similar to embodiment 1, at step S18. The reference data to be stored in the latch circuit 42 at this step S18 is the read data of page Pn−1. This is because that page Pn−1 is written after page Pn. At step S19, multi-value data is read out to the sense amp circuit under a condition determined by the reference data held in the latch circuit 42 as similar to that of embodiment 1. At step S20, the decided data is output to outside of the chip.

In this embodiment as described above, the to-be-written data into the NAND type flash memory 51 is temporarily stored in the cache memory. Due to this fact, there are some limitations for achieving the read scheme. For example, assume that a data write is preformed from page P0 to page P7 on receipt of a write demand. In this case, write data are transferred from the region 54 of the cache memory to the NAND type flash memory 51 under the control of the controller 52, thereby being written in order of Page P7, P6, . . . , P0.

With respect to the above-described write state, data read from page P0 to page P7 may be normally performed by the steps S15–S17 in FIG. 15. However, in this case, the region from page P8 to page P15 in the selected cell block of the NAND type flash memory 51 is empty (i.e., not written). In this state, if an additional write is performed for pages P8 to P15, it becomes impossible to continuously read out pages P7 and P8. The reason is in that data of page P7 have to be written after data of page P8 in this embodiment.

In order to deal with the above-described state, it is required to control the data read as follows: read data of pages P0 to P7 from the flash memory 51 to the cache memory 53 before the additional write; sequentially store the additional write dada of pages P8 to P15 in the caches memory 53; and then control to continuously write the entire page data for a cell block into the NAND flash memory 51.

The memory card of this embodiment includes the NAND type flash memory 51, the controller 52 for controlling data input/output of the memory 51, and the cache memory 53 able to store write data for at least one cell block, thereby becoming to be capable of a data write in a cell block of the NAND flash memory 51 in such a manner that the page write is performed in order from the lower address as being reversed to the ordinary case. As a result, it is possible to achieve a read operation for reducing the influence of the interference of neighboring cell without reducing the performance of dada read. It is specifically appreciated that it need not read a reference data in a continuous page read operation, thereby improving read efficiency.

[EMBODIMENT 3]

In the, embodiment 1, in order to set a read condition corresponding to the interference between cells, the read voltage applied to the selected word line has been changed. It can be said that this is a method for directing the difference of the memory cell threshold voltage due to the influence of the interference between memory cells. In contrast to this, it is also possible to use the difference of the bit line discharge times during data sensing as a method of setting the read condition corresponding to the difference of memory cell threshold due to the interference between cells. It is because that the written threshold voltage difference of memory cells causes the bit line discharge curves by these memory cells during data sensing to be different.

Figure 16:
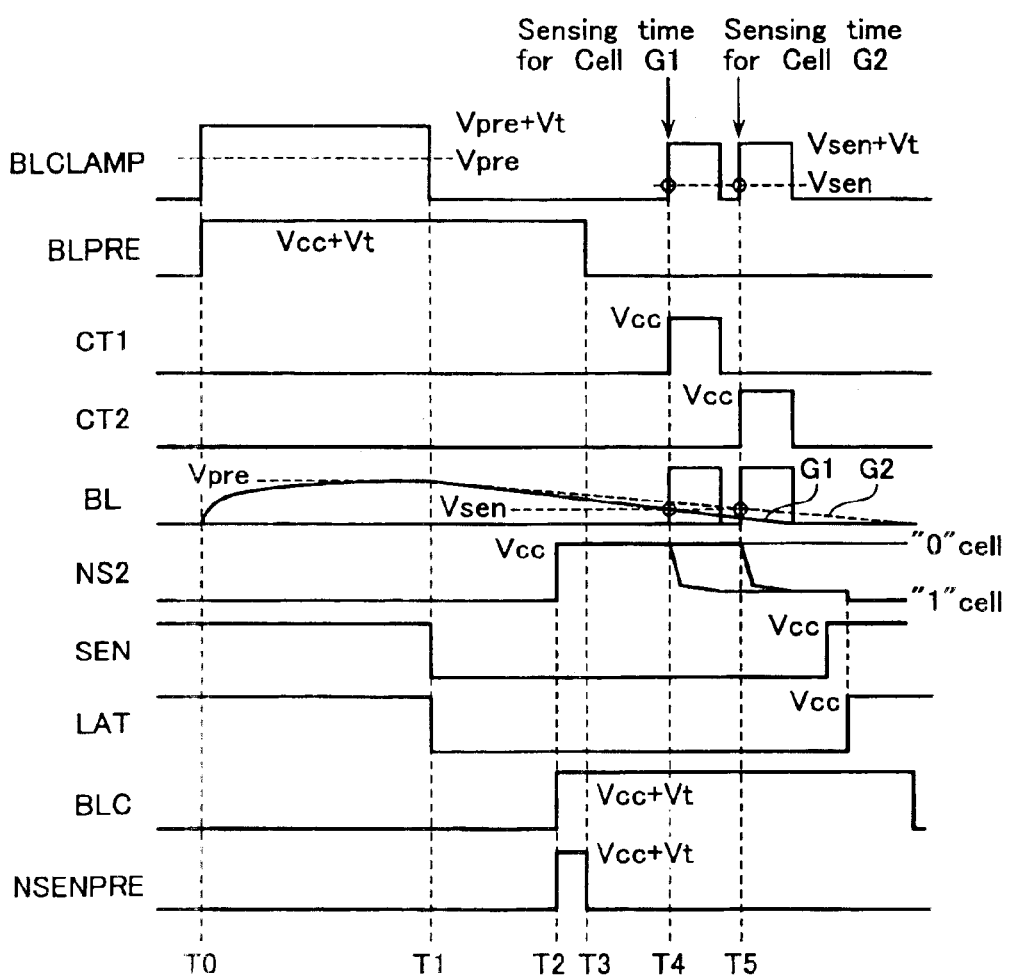
FIG. 16 shows waveforms of data read operation of a flash memory according to another embodiment.

FIG. 16 shows waveforms of a read operation READ2 for a selected page corresponding to FIG. 12 of the embodiment 1, in accordance with an embodiment 3 in which the above-described difference of bit line discharge times is used. It is the same as the embodiments 1 that read operation READ1 for obtaining a reference data is performed prior to the read operation READ2. Although the voltage waveforms for the selected word line and the select gate lines are not shown, these are the same as the embodiment 1 except that the reads voltage applied to the selected word line is held at a certain value without alternation.

Figure 17:
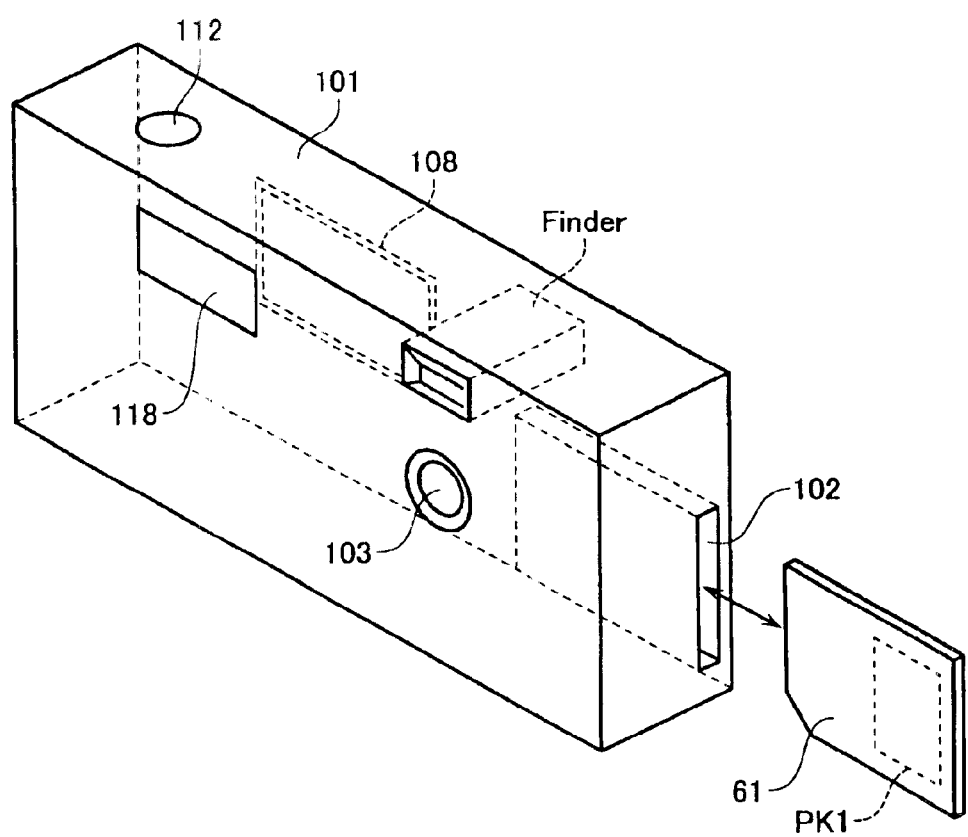
FIG. 17 shows another embodiment applied to a digital still camera.

The bit line is precharged during timing T0 to T1, and then discharged by the NAND cell unit. After starting the bit line discharge, and before sensing the bit line, the sense node NS2 is precharged from timing T2 to T3. These operations are the same as that of the embodiment 1. In FIG. 16, bit line discharge curves of memory cell G1 and G2, the former being without affection by neighboring cell, the latter being affected by neighboring cell, are shown by solid and dotted lines, respectively. As a threshold difference is generated between memory cells corresponding to whether the interference of cells exists or not, it causes the bit line curves of the memory cells to be different in a select time as shown in FIG. 17. Therefore, in this embodiment, the bit line sense timing is determined corresponding to the difference of the bit line discharge curves.

In detail, in a case that memory cell G1 is selected, the bit line sense is performed by the control signal CT1 rising at timing T4 together with the sensing signal BLCLAMP. In a case that memory cell G2 is selected, the bit line sense is performed by the control signal CT2 rising at timing T5 delayed to T4 with the sensing signal BLCLAMP. As similar to the embodiment 1, a reference data is held in the sense amp circuit SA, whereby one of the data transfer circuits 30a, 30b becomes active. Therefore, a read data sensed at a timing of the control signal CT1 or CT2 becomes effective. In accordance with this embodiment, the same advantageous effect as that of the embodiment 1 may also be obtained.

[EMBODIMENT 4]

As an embodiment, an electric card using the non-volatile semiconductor memory devices according to the above-described embodiments 1–3 of the present invention and an electric device using the card will be described bellow.

FIG. 17 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 18:
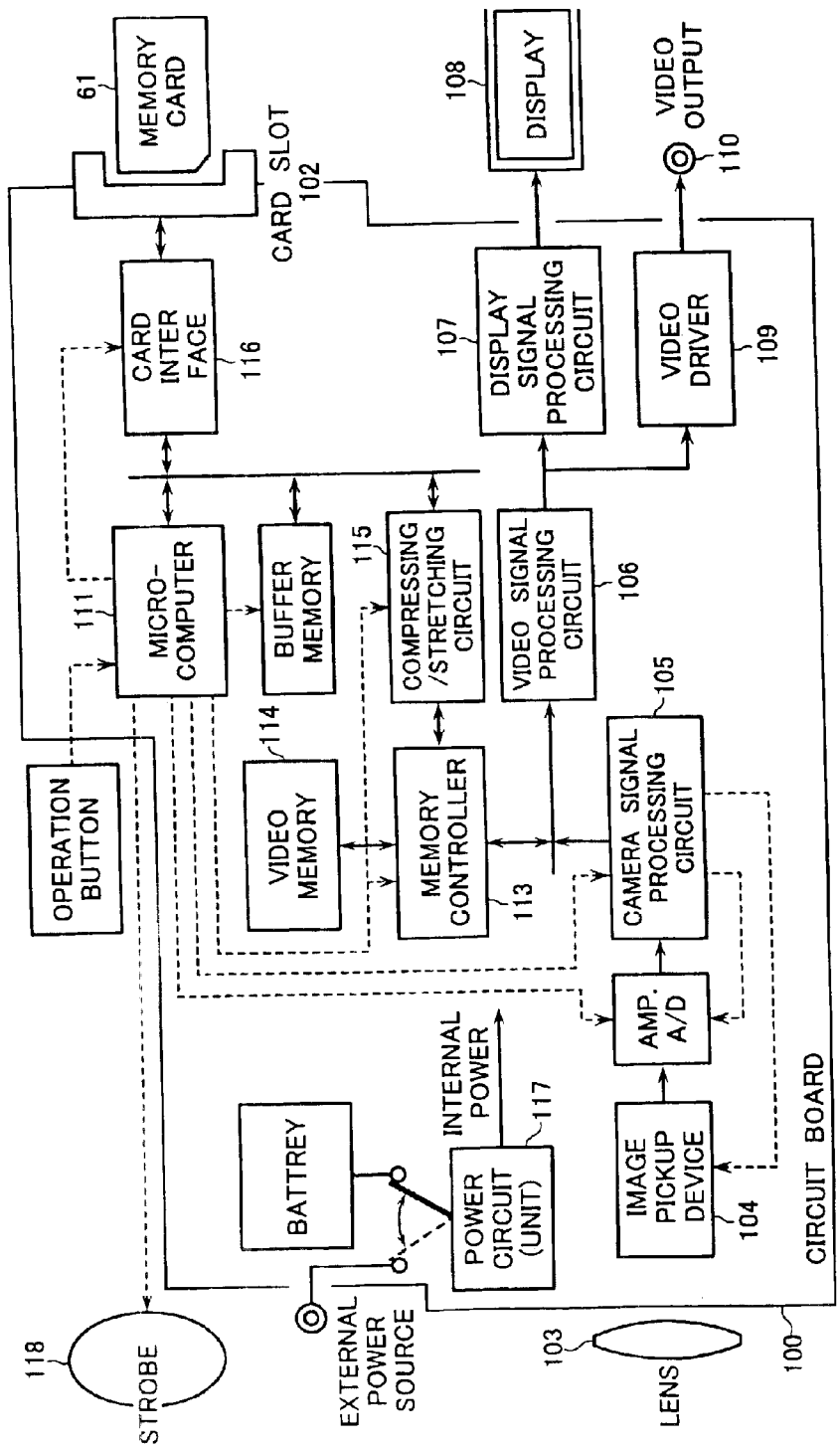
FIG. 18 shows the internal configuration of the digital still camera.
Figure 19A:
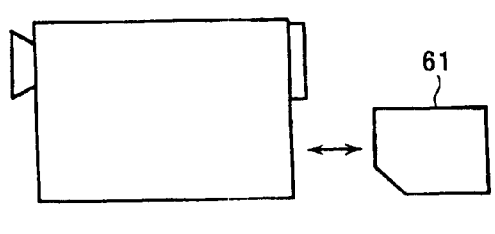
FIGS. 19A to 19J show other electric devices to which the embodiment is applied.
Figure 19F:
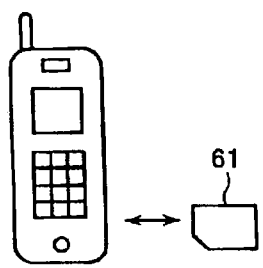
Figure 19B:
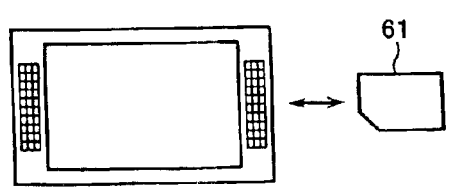
Figure 19G:
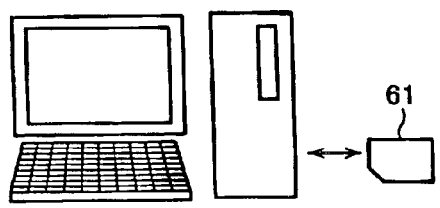
Figure 19C:
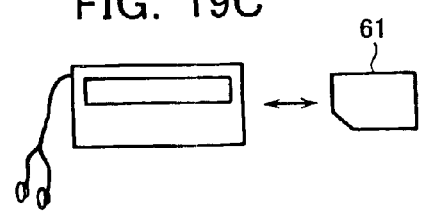
Figure 19H:
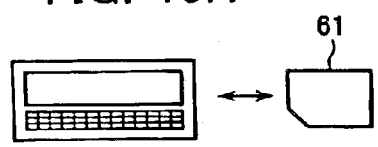
Figure 19D:
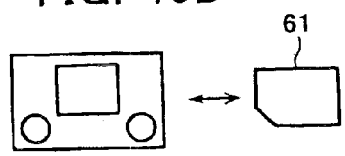
Figure 19I:
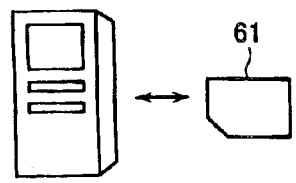
Figure 19E:
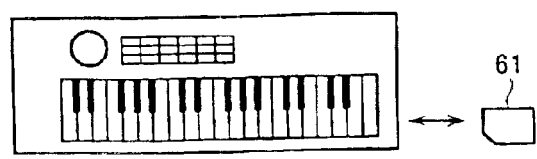
Figure 19J:
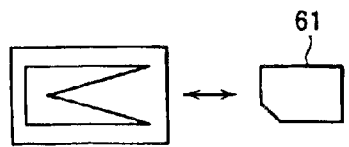
Figure 20:
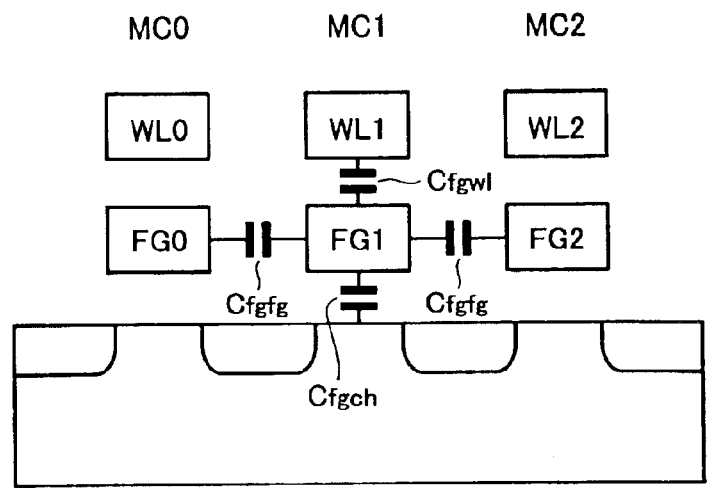
FIG. 20 is a diagram for explaining the interference between adjacent memory cells in a NAND type flash memory.
Figure 21:
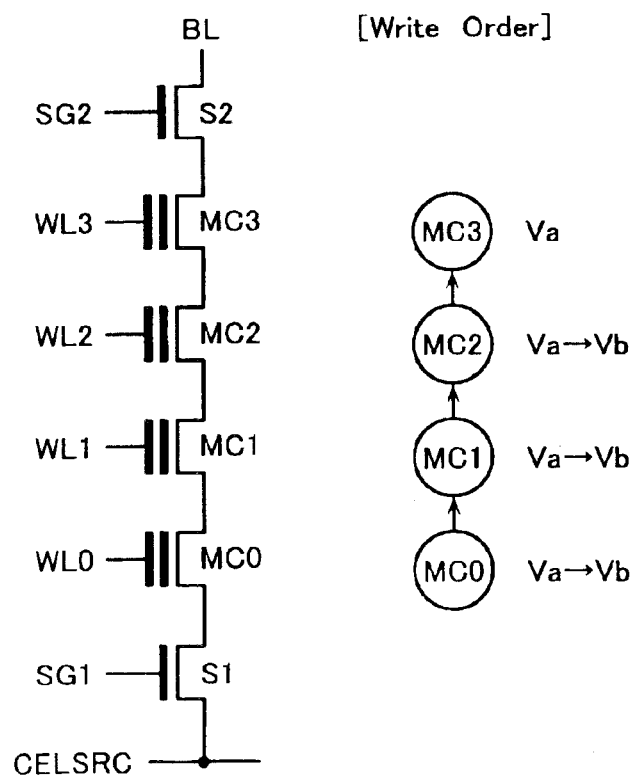
FIG. 21 shows a write order and threshold change in the prior NAND type flash memory.
Figure 22:
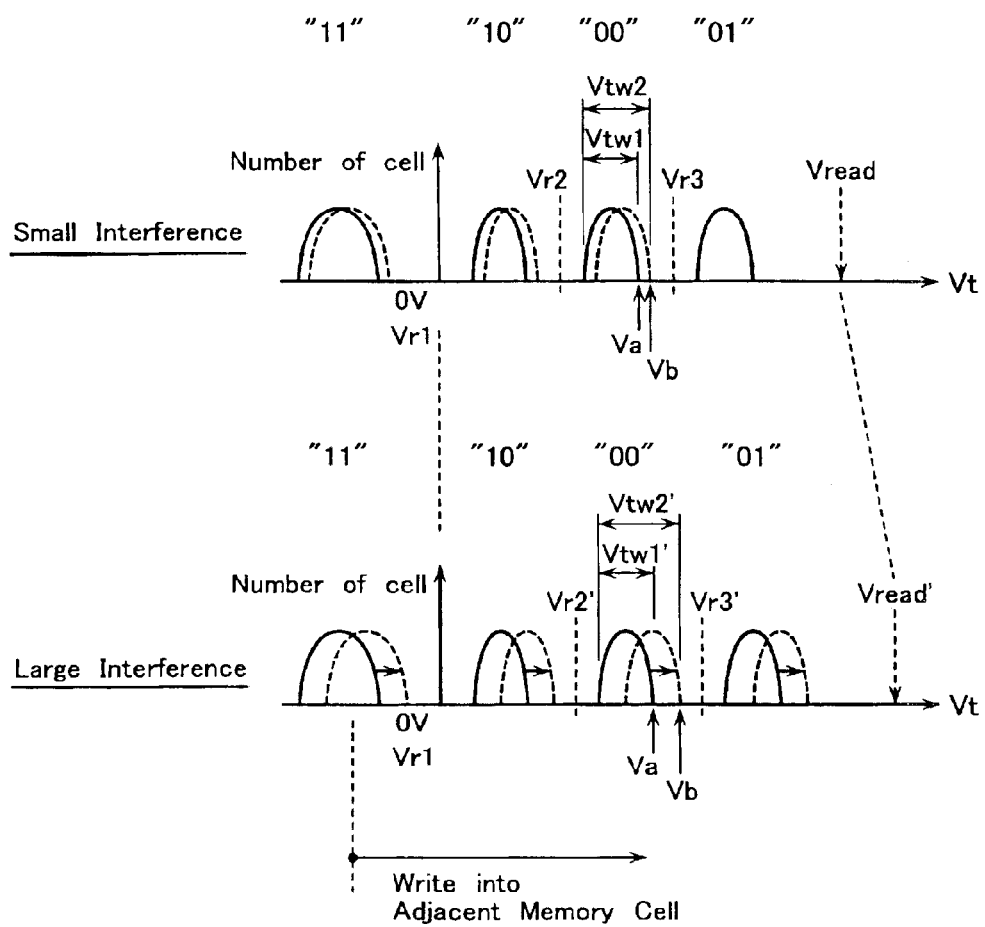
FIG. 22 shows data distribution of the prior NAND type flash memory.

FIG. 18 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 19A to 19J, as well as in portable electric devices. That is, the electric card can also be used in a video camera shown in FIG. 19A, a television set shown in FIG. 19B, an audio apparatus shown in FIG. 19C, a game apparatus shown in FIG. 19D, an electric musical instrument shown in FIG. 19E, a cell phone shown in FIG. 19F, a personal computer shown in FIG. 19G, a personal digital assistant (PDA) shown in FIG. 19H, a voice recorder shown in FIG. 19I, and a PC card shown in FIG. 19J.

The aforementioned embodiments are merely examples and hence do not restrict the present invention. Although a NAND-type flash memory device is explained in the above-described embodiments, the present invention is applicable to, for example, a NOR-type, DINOR-type, and the like non-volatile semiconductor memory devices.

What is claimed is:

1. A non-volatile semiconductor memory device comprising:

a memory cell array in which electrically rewritable floating gate type memory cells are arranged; and a plurality of sense amplifier circuits configured to read data from said memory cell array, wherein each of said sense amplifier circuits is configured to sense cell data of a first memory cell selected from said memory cell array under a read condition determined in correspondence with cell data of a second memory cell adjacent to said first memory cell and written after said first memory cell, and wherein each said sense amplifier circuit comprises a first latch circuit for holding a read data of said first memory cell and a second latch circuit for holding a data read out from said second memory cell prior to data read of said first memory cell as a reference data.

2. The non-volatile semiconductor memory device according to claim 1, wherein each of said sense amplifier circuits further comprises:

a first sense node connected to a bit line of said memory cell array via a clamping transistor used for clamping and amplifying bit line potential;

a second sense node to which said first and second latch circuits are commonly connected through the respective transfer gates; and first and second data transfer circuits disposed in parallel between said first and second sense nodes, said first and second data transfer circuits being switched in response to said reference data held in said second latch circuit to selectively transfer one of cell data of said first memory cell under first and second read conditions to said first latch circuit.

3. The non-volatile semiconductor memory device according to claim 2, wherein said first and second read conditions are determined by changing a read voltage applied to said first memory cell.

4. The non-volatile semiconductor memory device according to claim 2, wherein said first and second read conditions are determined as corresponding to differences of bit line discharge times determined due to said first memory cell.

5. The non-volatile semiconductor memory device according to claim 2, wherein said first data transfer circuit comprises first and second transistors serially disposed between said first and second sense nodes, said first transistor being gate-controlled by a first data node of said second latch circuit, said second transistor being driven by a first sense-use control signal to turn on, and wherein said second data transfer circuit comprises third and fourth transistors serially disposed between said first and second sense nodes, said third transistor being gate-controlled by a second data node of said second latch circuit, said fourth transistor being driven by a second sense-use control signal to turn on, said second sense-use control signal being generated at a timing different from that of said first sense-use control signal.

6. The non-volatile semiconductor memory device according to claim 2, wherein each said sense amplifier circuit further comprises:

a first precharge transistor connected to said first sense node for precharging a selected bit line of said memory cell array; and a second precharge transistor connected to said second sense node for precharging said second sense node.

7. The non-volatile semiconductor memory device according to claim 1, wherein said memory cell array comprises a plurality of NAND cell units arranged therein, each NAND cell unit having a serial circuit of a plurality of memory cells, a first select gate transistor disposed between one end of said serial circuit and a bit line, and a second select gate transistor disposed between the other end of said serial circuit and a common source line, each said memory cell having a floating gate and a control gate stacked thereabove.

8. The non-volatile semiconductor memory device according to claim 7, wherein the control gates of said memory cells in each said NAND cell unit are connected to different word lines, respectively, and wherein the gates of said first and second select gate transistors in each said NAND cell unit are connected to select gate lines, respectively.

9. The non-volatile semiconductor memory device according to claim 8, wherein
   a plurality of memory cells arranged along a word line and connected to different bit lines, respectively, constitute a page which serves as a unit for parallel data read and parallel data write, and wherein
   said plurality of sense amplifier circuits constitute a page buffer for sensing data of one page.

10. A memory system comprising:
   a non-volatile semiconductor memory device;
   a cache memory for temporarily storing data input to and output from said non-volatile semiconductor memory device; and
   a controller for controlling data transfer between said cache memory and said non-volatile semiconductor memory device in such a manner that a data rewrite operation of said non-volatile semiconductor memory device is performed for a rewrite region directed from external in order from the uppermost address of said rewrite region,
   wherein said nonvolatile memory device comprises:
   a memory cell array in which electrically rewritable floating gate type memory cells are arranged; and
   a plurality of sense amplifier circuits configured to read data from said memory cell array, wherein
   each of said sense amplifier circuits is configured to sense cell data of a first memory cell selected from said memory cell array under a read condition determined in correspondence with cell data of a second memory cell adjacent to said first memory cell and written after said first memory cell,
   and wherein each said sense amplifier circuit comprises a first latch circuit for holding a read data of said first memory cell and a second latch circuit for holding a data read out from said second memory cell prior to data read of said first memory cell as a reference data.

11. The memory system according to claim 10, wherein
   said non-volatile semiconductor memory device comprises a plurality of cell blocks each serving as a unit for a data erase in a lump, and wherein
   said cache memory has a data storing area with a capacity larger than that of each said cell block, and wherein
   said controller controls to store data, which is to be written into a cell block of said non-volatile semiconductor memory device, in said cache memory, and then transfer the stored data to said non-volatile semiconductor memory device, thereby starting a data write operation.

12. An electric card equipped with a non-volatile semiconductor memory device, wherein said non-volatile memory device comprises:
   a memory cell array in which electrically rewritable floating gate type memory cells are arranged; and
   a plurality of sense amplifier circuits configured to read data from said memory cell array, wherein
   each of said sense amplifier circuits is configured to sense cell data of a first memory cell selected from said memory cell array under a read condition determined in correspondence with cell data of a second memory cell adjacent to said first memory cell and written after said first memory cell,
   and wherein each said sense amplifier circuit comprises a first latch circuit for holding a read data of said first memory cell and a second latch circuit for holding a data read out from said second memory cell prior to data read of said first memory cell as a reference data.

13. An electric card equipped with a memory system comprising:
   a non-volatile semiconductor memory device,
   a cache memory for temporarily storing data input to and output from said non-volatile semiconductor memory device; and
   a controller for controlling data transfer between said cache memory and said non-volatile semiconductor memory device in such a manner that a data rewrite operation of said non-volatile semiconductor memory device is performed for a rewrite region directed from external in order from the uppermost address of said rewrite region;
   wherein said non-volatile semiconductor memory device comprises:
   a memory cell array in which electrically rewritable floating gate type memory cells are arranged; and
   a plurality of sense amplifier circuits configured to read data from said memory cell array, wherein
   each of said sense amplifier circuits is configured to sense cell data of a first memory cell selected from said memory cell array under a read condition determined in correspondence with cell data of a second memory cell adjacent to said first memory cell and written after said first memory cell,
   wherein each said sense amplifier circuit comprises a first latch circuit for holding a read data of said first memory cell and a second latch circuit for holding a data read out from said second memory cell prior to data read of said first memory cell as a reference data,
   wherein said non-volatile semiconductor memory device comprises a plurality of cell blocks each serving as a unit for a data erase in a lump, and wherein
   said cache memory has a data storing area with a capacity larger than that of each said cell block, and wherein
   said controller controls to store data, which is to be written into a cell block of said non-volatile semiconductor memory device, in said cache memory, and then transfer the stored data to said non-volatile semiconductor memory device, thereby starting a data write operation.

14. An electric device comprising:
   a card interface;
   a card slot connected to said card interface; and
   an electric card electrically connectable to said card slot, wherein said electric card is equipped with a non-volatile semiconductor memory device, wherein said non-volatile memory device comprises:
   a memory cell array in which electrically rewritable floating gate type memory cells are arranged; and
   a plurality of sense amplifier circuits configured to read data from said memory cell array, wherein
   each of said sense amplifier circuits is configured to sense cell data of a first memory cell selected from said memory cell array under a read condition determined in correspondence with cell data of a second memory cell adjacent to said first memory cell and written after said first memory cell,
   and wherein each said sense amplifier circuit comprises a first latch circuit for holding a read data of said first memory cell and a second latch circuit for holding a data read out from said second memory cell prior to data read of said first memory cell as a reference data.

15. An electric device comprising:

a card interface;

a card slot connected to said card interface; and an electric card electrically connectable to said card slot, wherein said electric card is equipped with a memory system comprising:

a non-volatile semiconductor memory device, a cache memory for temporarily storing data input to and output from said non-volatile semiconductor memory device; and a controller for controlling data transfer between said cache memory and said non-volatile semiconductor memory device in such a manner that a data rewrite operation of said non-volatile semiconductor memory device is performed for a rewrite region directed from external in order from the uppermost address of said rewrite region;

wherein said non-volatile semiconductor memory device comprises:

a memory cell array in which electrically rewritable floating gate type memory cells are arranged; and a plurality of sense amplifier circuits configured to read data from said memory cell array, wherein each of said sense amplifier circuits is configured to sense cell data of a first memory cell selected from said memory cell array under a read condition determined in correspondence with cell data of a second memory cell adjacent to said first memory cell and written after said first memory cell, and wherein each said sense amplifier circuit comprises a first latch circuit for holding a read data of said first memory cell and a second latch circuit for holding a data read out from said second memory cell prior to data read of said first memory cell as a reference data.

16. The electric device according to claim 14, wherein said electric device is a digital still camera.

17. The electric device according to claim 15, wherein said electric device is a digital still camera.

* * * * *